(12) United States Patent
Lee et al.

(10) Patent No.: US 12,279,498 B2
(45) Date of Patent: *Apr. 15, 2025

(54) ORGANIC LIGHT EMITTING DIODE DISPLAY DEVICE INCLUDING A POWER SUPPLY WIRE

(71) Applicant: SAMSUNG DISPLAY CO., LTD., Yongin-si (KR)

(72) Inventors: Bongwon Lee, Seoul (KR); Yanghee Kim, Cheonan-si (KR); Hyun-Chol Bang, Seongnam-si (KR); Sujin Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/544,416

(22) Filed: Dec. 18, 2023

(65) Prior Publication Data

US 2024/0122015 A1 Apr. 11, 2024

Related U.S. Application Data

(63) Continuation of application No. 17/658,600, filed on Apr. 8, 2022, now Pat. No. 11,849,614, which is a
(Continued)

(30) Foreign Application Priority Data

Mar. 19, 2019 (KR) ........................ 10-2019-0031034

(51) Int. Cl.
*H10K 59/131* (2023.01)
*H10K 50/842* (2023.01)
(Continued)

(52) U.S. Cl.
CPC ....... *H10K 59/131* (2023.02); *H10K 50/8426* (2023.02); *H10K 59/121* (2023.02); *H10K 59/124* (2023.02)

(58) Field of Classification Search
CPC ............. H01L 27/3276; H01L 27/3258; H01L 27/326; H01L 51/5246
See application file for complete search history.

(56) References Cited

U.S. PATENT DOCUMENTS 7,595,854 B2 9/2009 Sung et al.
9,660,011 B2 6/2017 Kim et al.
(Continued)

FOREIGN PATENT DOCUMENTS

CN 101140945 A 3/2008
JP 2013-118074 6/2013
(Continued)

OTHER PUBLICATIONS

Office action dated Dec. 25, 2024, in corresponding Chinese Patent Application No. 202010195381.9, 9 pages.

*Primary Examiner* — Fernando L Toledo
*Assistant Examiner* — Neil R Prasad
(74) *Attorney, Agent, or Firm* — F. CHAU & ASSOCIATES, LLC

(57) ABSTRACT

An organic light emitting diode display includes a lower substrate, a sub-pixel structure, an upper substrate, a sealant, and a first power supply wire. The lower substrate has a display area, a peripheral area, and a pad area. The sub-pixel structure is disposed in the display area on the lower substrate. The upper substrate is disposed on the sub-pixel structure. The sealant is disposed in the peripheral area between the lower substrate and the upper substrate. The first power supply wire is disposed between the lower substrate and the sealant, and overlaps the lower substrate and the sealant. The first power supply wire includes a first
(Continued)

protrusion protruding in a first direction that is a direction from the pad area to the display area in the first peripheral area.

20 Claims, 20 Drawing Sheets

Related U.S. Application Data continuation of application No. 16/795,188, filed on Feb. 19, 2020, now Pat. No. 11,309,379.

(51) Int. Cl.
*H10K 59/121* (2023.01)
*H10K 59/124* (2023.01)

(56) References Cited

U.S. PATENT DOCUMENTS

| | | | |
|---|---|---|---|
| 9,818,975 | B2 | 11/2017 | Hong et al. |
| 9,954,200 | B2 | 4/2018 | Kim et al. |
| 10,439,163 | B2 | 10/2019 | Su et al. |
| 11,309,379 | B2 * | 4/2022 | Lee ................ H10K 59/124 |
| 11,849,614 | B2 * | 12/2023 | Lee ................ H10K 59/121 |
| 2005/0184927 | A1 | 8/2005 | Kwak |
| 2012/0126268 | A1 | 6/2012 | Lee et al. |
| 2016/0013441 | A1 | 1/2016 | Hong |
| 2016/0104757 | A1 | 4/2016 | Kim et al. |
| 2016/0268640 | A1 | 9/2016 | Kim et al. |
| 2018/0006268 | A1 | 1/2018 | Hong et al. |
| 2019/0043938 | A1 | 2/2019 | Lee et al. |
| 2019/0081270 | A1 | 3/2019 | Kim et al. |
| 2020/0212356 | A1 | 7/2020 | Kim et al. |
| 2020/0303488 | A1 | 9/2020 | Lee et al. |
| 2022/0231111 | A1 | 7/2022 | Lee et al. |

FOREIGN PATENT DOCUMENTS

| | | |
|---|---|---|
| KR | 10-2016-0136724 | 12/2015 |
| KR | 10-2016-0046072 | 4/2016 |
| KR | 10-2017-0090382 A | 8/2017 |

* cited by examiner

ORGANIC LIGHT EMITTING DIODE DISPLAY DEVICE INCLUDING A POWER SUPPLY WIRE

CROSS-REFERENCE TO RELATED APPLICATION

This application is a Continuation of co-pending U.S. patent application Ser. No. 17/658,600, filed on Apr. 8, 2022, which is a Continuation of U.S. patent application Ser. No. 16/795,188 filed on Feb. 19, 2020, which claims priority under 35 USC § 119 to Korean Patent Application No. 10-2019-0031034, filed on Mar. 19, 2019 in the Korean Intellectual Property Office (KIPO), the entire disclosures of which are herein incorporated by reference.

TECHNICAL FIELD

The present disclosure relates to an organic light emitting diode display device and, more particularly, to an organic light emitting diode (OLED) display device including a power supply wire.

DISCUSSION OF THE RELATED ART

Flat panel display devices have rapidly replaced cathode ray tube (CRT) display device because the flat panel display device is lighter weight and thinner than a CRT display device having a comparable display area. A liquid crystal display (LCD) device and an organic light emitting diode (OLED) display device are commonly used examples of flat panel display devices.

An organic light emitting diode (OLED) display device may include a display area, a peripheral area surrounding the display area, and a pad area located at one side of the peripheral area. A plurality of pixel circuits and a plurality of organic light emitting diodes may be disposed in the display area. A power supply wire and a sealant may be disposed in the peripheral area. In addition, a plurality of pad electrodes may be disposed in the pad area. For example, a low power supply voltage may be generated from an external device, and the low power supply voltage may be provided to the power supply wire through the pad electrodes. In addition, the low power supply voltage applied to the power supply wire may be provided to a cathode electrode of the organic light emitting diode. In addition, the power supply wire disposed in the peripheral area adjacent to the pad area might not overlap the sealant. In this way, the power supply wire is arranged in parallel to the sealant in the peripheral area adjacent to the pad area. This arrangement may produce a relatively large dead space of the organic light emitting diode display device in which no image is displayed.

SUMMARY

According to some exemplary embodiments of the present inventive concept, an organic light emitting diode display device includes a lower substrate, a sub-pixel structure, an upper substrate, a sealant, and a first power supply wire. The lower substrate has a display area, a peripheral area at least partially surrounding the display area, and a pad area located at one side of the peripheral area. The sub-pixel structure is disposed in the display area on the lower substrate. The upper substrate is disposed on the sub-pixel structure. The sealant is disposed in the peripheral area between the lower substrate and the upper substrate. The sealant includes a first sealing portion located in a first peripheral area, which is located adjacent to the pad area, of the peripheral area and a second sealing portion located in a second peripheral area, which is different from the first peripheral area, of the peripheral area. The first power supply wire is disposed between the lower substrate and the sealant. The first power supply wire overlaps both the lower substrate and the sealant. The first power supply wire includes a first protrusion that protrudes from a first side of the first sealing portion in a first direction. The first direction is a direction from the pad area to the display area in the first peripheral area.

In exemplary embodiments of the present inventive concept, the first power supply wire may further include a second protrusion protruding from a second side of the first sealing portion in a second direction that is opposite to the first direction in the first peripheral area.

In exemplary embodiments of the present inventive concept, the organic light emitting diode display device may further include a plurality of pad electrodes disposed in the pad area. The pad electrodes may be arranged along a third direction that is orthogonal to the first and second directions.

In exemplary embodiments of the present inventive concept, the first protrusion may be adjacent to the sub-pixel structure, and the second protrusion may be adjacent to the pad electrodes.

In exemplary embodiments of the present inventive concept, the first power supply wire may include a first wire portion located in a part of the first peripheral area and a second wire portion located in the second peripheral area. The first and second wire portions may be a single integrated unit, and the first power supply wire may have a ring shape with an opened lower portion.

In exemplary embodiments of the present inventive concept, the organic light emitting diode display device may further include a second power supply wire disposed within the first power supply wire in the first peripheral area on the lower substrate. A high power supply voltage may be applied to the second power supply wire.

In exemplary embodiments of the present inventive concept, a first width, which is measured in the first direction, of the first wire portion of the first power supply wire may be greater than a second width, which is measured in a direction from the second peripheral area to the display area, of the second wire portion of the first power supply wire.

In exemplary embodiments of the present inventive concept, the first power supply wire may further include a third protrusion protruding from the second sealing portion in a direction from the second peripheral area to the display area in the second peripheral area.

In exemplary embodiments of the present inventive concept, the first power supply wire located in the second peripheral area may include a first end corresponding to the third protrusion protruding from the second sealing portion and a second end opposite to the first end, and the second sealing portion may cover the second end.

In exemplary embodiments of the present inventive concept, the first sealing portion and the second sealing portion may be a single integrated unit.

In exemplary embodiments of the present inventive concept, the sub-pixel structure may include a lower electrode disposed on the lower substrate, a light emitting layer disposed on the lower electrode, and an upper electrode disposed on the light emitting layer. A low power supply voltage may be applied to the first power supply wire, and may be provided to the upper electrode through the power supply wire.

In exemplary embodiments of the present inventive concept, the organic light emitting diode display device may further include a connection pattern disposed between the upper electrode and the first power supply wire. The upper electrode may be electrically connected to the first power supply wire through the connection pattern.

In exemplary embodiments of the present inventive concept, the connection pattern may be simultaneously formed with the lower electrode using a same material.

In exemplary embodiments of the present inventive concept, the organic light emitting diode display device may further include a semiconductor element disposed between the sub-pixel structure and the lower substrate and a planarization layer disposed between the semiconductor element and the sub-pixel structure.

In exemplary embodiments of the present inventive concept, the semiconductor element may include an active layer disposed in the display area on the substrate, a gate insulating layer disposed on the active layer, a gate electrode disposed on the gate insulating layer, an interlayer insulating layer disposed on the gate electrode, and source and drain electrodes disposed on the interlayer insulating layer.

In exemplary embodiments of the present inventive concept, the first power supply wire may be located on a same layer as the source and drain electrodes.

In exemplary embodiments of the present inventive concept, the first sealing portion may contact the first power supply wire, and the second sealing portion may contact each of the first power supply wire and the interlayer insulating layer.

In exemplary embodiments of the present inventive concept, the first power supply wire may be spaced apart from the planarization layer.

In exemplary embodiments of the present inventive concept, the sealant may have a substantially rectangular planar shape having an opening exposing the display area, in a plan view.

In exemplary embodiments of the present inventive concept, a total length of the second peripheral area and the pad area extending in the first direction may be 2.22 mm or less.

In an organic light emitting diode display device according to exemplary embodiments of the present invention, as the power supply wire at least partially overlaps the sealant in the first peripheral area, and the dead space of the first peripheral area may be reduced. Accordingly, the organic light emitting diode display device can function as a full screen display device, which is understood to be a display device without any perceivable bezel in which an image is displayed right up to the edges of the display device.

In addition, the power supply wire disposed in the first peripheral area may have the first width that is relatively large, so that a wire resistance can be reduced. Accordingly, the driving voltage and the power consumption of the organic light emitting diode display device can be reduced.

Further, the power supply wire may function as both a wire capable of providing the low power supply voltage and a metal layer capable of absorbing and reflecting the energy of the laser light. Accordingly, it is not necessary to additionally dispose a metal layer capable of absorbing and reflecting the energy of the laser light, so that the manufacturing cost of the organic light emitting diode display device can be reduced.

BRIEF DESCRIPTION OF THE DRAWINGS

Exemplary embodiments of the present inventive concept can be understood in more detail from the following description taken in conjunction with the accompanying drawings, in which.

DETAILED DESCRIPTION OF THE EMBODIMENTS

Figure 1:
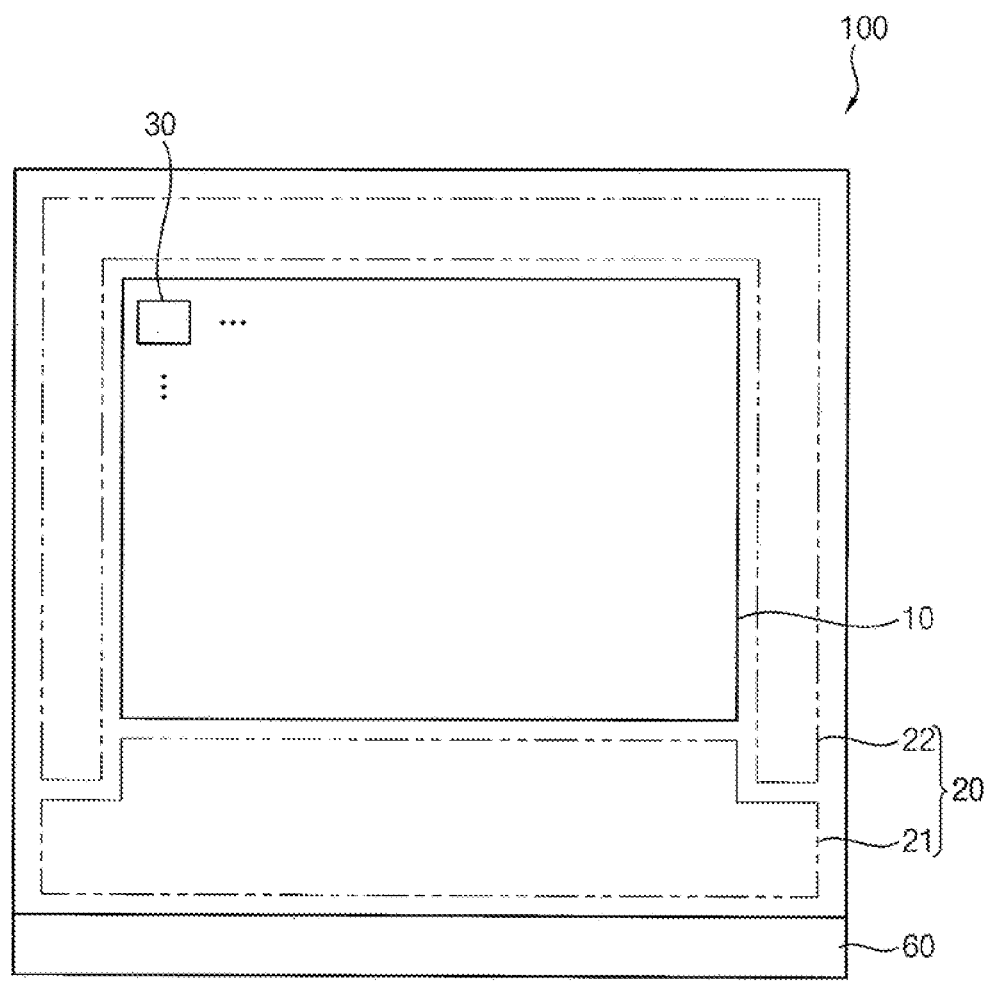
FIG. 1 is a plan view illustrating an organic light emitting diode display according to exemplary embodiments of the present invention.

Hereinafter, organic light emitting diode display devices and a method of manufacturing the organic light emitting diode display devices according to exemplary embodiments of the present invention will be described in detail with reference to the accompanying drawings. In the accompanying drawings and the specification, same or similar reference numerals may refer to the same or similar elements. Similar elements are elements that are different but perform comparable or identical functions in comparable or identical ways.

Figure 2:
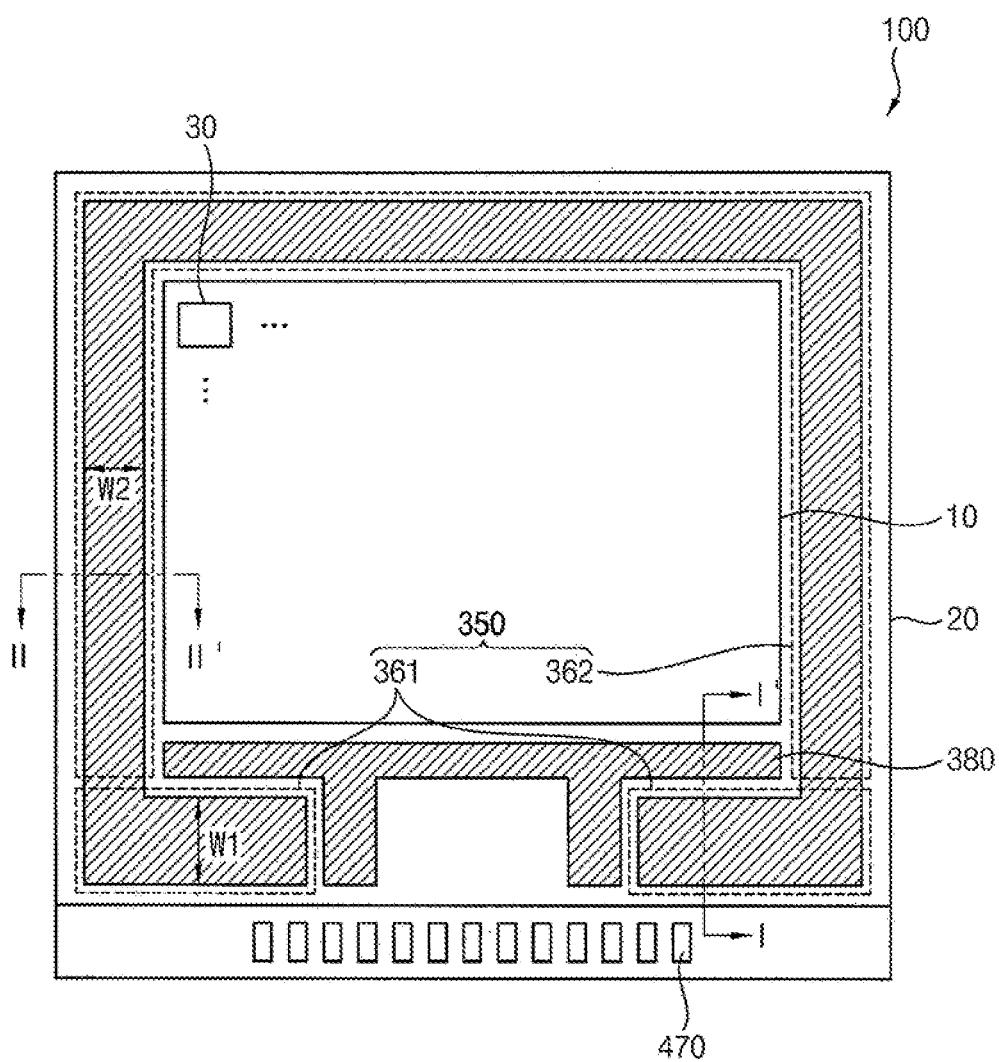
FIG. 2 is a plan view illustrating a power supply wire included in the organic light emitting diode display of FIG. 1.
Figure 3:
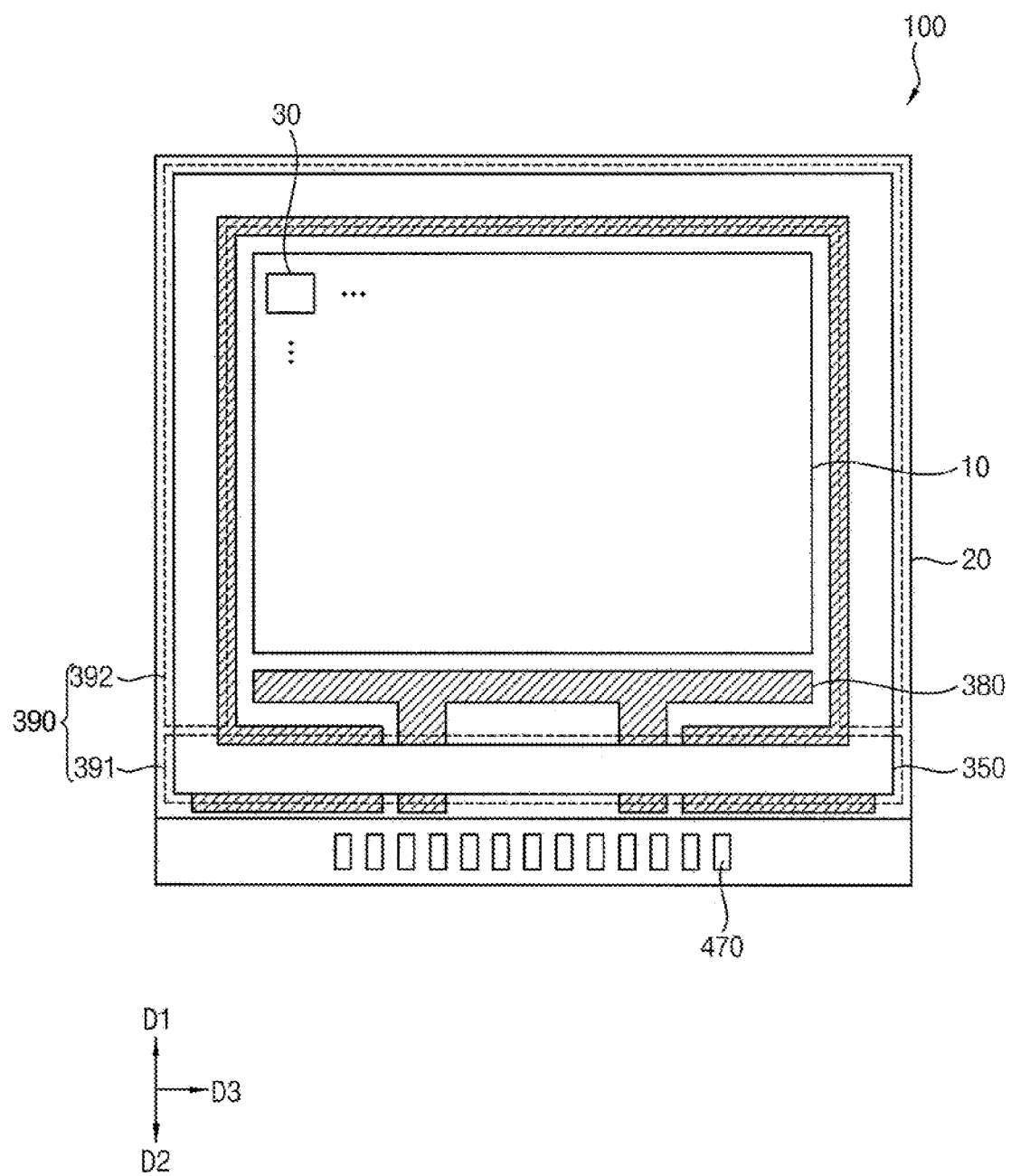
FIG. 3 is a plan view illustrating a sealant disposed on the power supply wire of FIG. 2.
Figure 4:
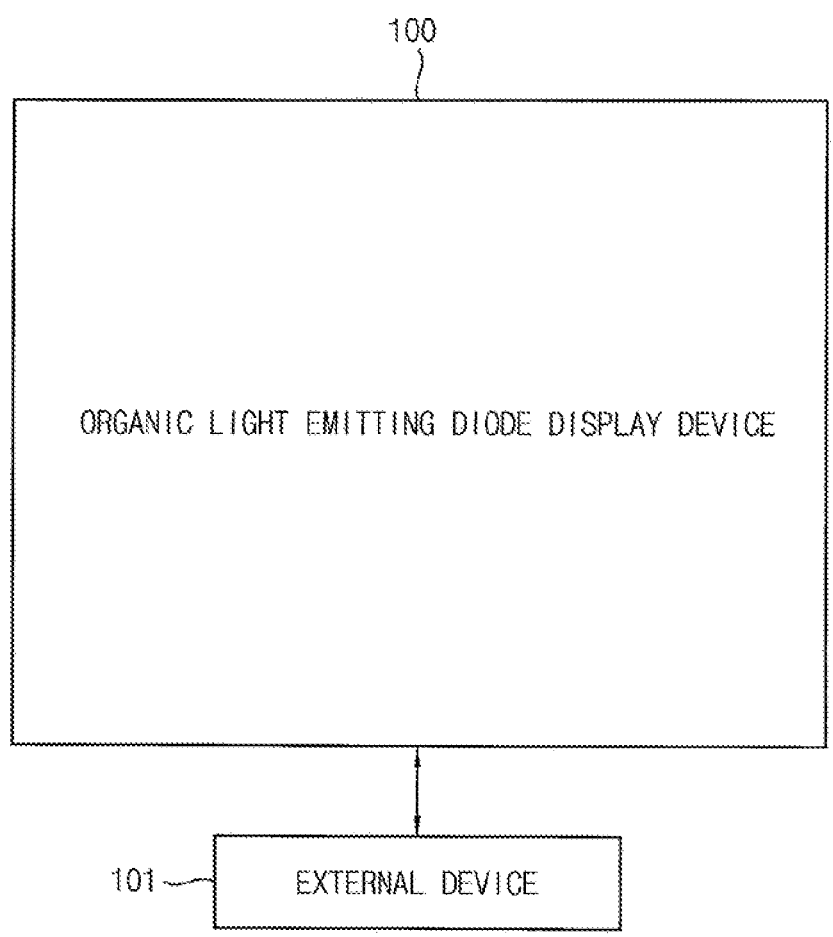
FIG. 4 is a block diagram illustrating an external device electrically connected to the organic light emitting diode display device of FIG. 2.

FIG. 1 is a plan view illustrating an organic light emitting diode display according to exemplary embodiments of the present invention. FIG. 2 is a plan view illustrating a power supply wire included in the organic light emitting diode display of FIG. 1. FIG. 3 is a plan view illustrating a sealant disposed on the power supply wire of FIG. 2. FIG. 4 is a block diagram illustrating an external device electrically connected to the organic light emitting diode display device of FIG. 2.

Referring to FIGS. 1, 2, 3, and 4, the organic light emitting diode display device 100 may include a first power supply wire 350, a second power supply wire 380, a sealant 390, pad electrodes 470, and the like, and may include a display area 10, a peripheral area 20, and a pad area 60. Here, the peripheral area 20 may substantially and at least partially surround the display area 10, and the pad area 60 may be located at one side of the peripheral area 20. In addition, the display area 10 may include a plurality of sub-pixel circuit areas 30. The peripheral area 20 may include a first peripheral area 21 and a second peripheral area 22. For example, the first peripheral area 21 may be located in the peripheral area 20 adjacent to the pad area 60, and the second peripheral area 22 may correspond to the remaining part of the peripheral area 20 except for the first peripheral area 21. For example, the first peripheral area 21 and the second peripheral area 22 may be different from each other and might not overlap each other. For example, the peripheral area 20 may have a hollow rectangular shape in a plan view. For example, the peripheral area 20 may have a rectangular planar shape having an opening exposing the display area 10.

The sub-pixel circuit areas 30 may be arranged entirely within the display area 10. For example, a sub-pixel circuit (SPC; for example, the semiconductor element 250 in FIGS. 6 and 7) may be disposed in each of the sub-pixel circuit areas 30, and an organic light emitting diode (OLED; for example, the sub-pixel structure 200 in FIGS. 6 and 7) may be disposed on the sub-pixel circuit (SPC). An image may be displayed on the display area 10 through the sub-pixel circuit (SPC) and the organic light emitting diode (OLED).

For example, first, second, and third sub-pixel circuits may be disposed in the sub-pixel circuit areas 30. The first sub-pixel circuit may be connected to a first organic light emitting diode configured to emit red light, the second sub-pixel circuit may be connected to a second organic light emitting diode configured to emit green light, and the third sub-pixel circuit may be connected to a third organic light emitting diode configured to emit blue light. In exemplary embodiments, the first organic light emitting diode may at least partially overlap the first sub-pixel circuit, the second organic light emitting diode may at least partially overlap the second sub-pixel circuit, and the third organic light emitting diode may at least partially overlap the third sub-pixel circuit. Alternatively, the first organic light emitting diode may at least partially overlap a part of the first sub-pixel circuit and a part of a sub-pixel circuit different from the first sub-pixel circuit, the second organic light emitting diode may at least partially overlap a part of the second sub-pixel circuit and a part of a sub-pixel circuit different from the second sub-pixel circuit, and the third organic light emitting diode may at least partially overlap a part of the third sub-pixel circuit and a part of a sub-pixel circuit different from the third sub-pixel circuit. For example, the first to third organic light emitting diodes may be arrayed using a scheme such as an RGB stripe type scheme in which rectangles having the same size are sequentially arrayed, an S-stripe type scheme including a blue organic light emitting diode having a relatively large area, a WRGB type scheme further including a white organic light emitting diode, and a PenTile scheme arranged to have an RG-GB repetition pattern.

In addition, at least one driving transistor, at least one switching transistor, at least one capacitor or the like may be disposed in each of the sub-pixel circuit areas 30. In exemplary embodiments, one driving transistor (for example, the first transistor TR1 in FIG. 5), six switching transistors (for example, the second to seventh transistors TR2, TR3, TR4, TR5, TR6, and TR7 in FIG. 5), one storage capacitor (for example, the storage capacitor CST in FIG. 5) and the like may be disposed in each of the sub-pixel circuit areas 30.

Although the display area 10, the sub-pixel circuit 30, and the pad area 60 of the present invention have a rectangular shape in a plan view, the shape is not limited thereto. For example, each of the display area 10, the sub-pixel circuit 30, and the pad area 60 may have a triangular shape, a rhombic shape, a polygonal shape, a circular shape, a stadium shape, or an oval shape, in a plan view.

A plurality of wires may be disposed in the peripheral area 20. For example, the plurality of wires may include a data signal wire, a gate signal wire, a light emission control signal wire, a gate initialization signal wire, an initialization voltage wire, a power supply voltage wire, and the like. The wires may extend from the peripheral area 20 to the display area 10 so as to be electrically connected to the sub-pixel circuit (SPC) and the organic light emitting diode (OLED). Further, a gate driver, a data driver, and the like may be disposed in the peripheral area 20.

In exemplary embodiments, as shown in FIGS. 2 and 3, the first power supply wire 350 may be disposed in a part of the peripheral area 20. For example, the first power supply wire 350 may be disposed in a part of the first peripheral area 21 and in the second peripheral area 22. The first power supply wire 350 may have a shape of a hook having an opened lower portion (for example, a ring having an opened lower portion such as an incomplete frame shape). In exemplary embodiments, the first power supply wire 350 may have a first width W1 in the first peripheral area 21, and may have a second width W2 that is less than the first width W1 in the second peripheral area 22. The first power supply wire 350 may be electrically connected to the pad electrodes 470 in the first peripheral area 21. For example, the first power supply wire 350 may be electrically connected to outermost pad electrodes 470 among the pad electrodes 470. A low power supply voltage may be applied to the first power supply wire 350, and the lower power supply voltage may be provided to a cathode electrode (for example, the upper electrode 340 in FIG. 6).

In addition, the second power supply wire 380 may be disposed in a part of the peripheral area 20. For example, the second power supply wire 380 may be disposed in a part of the first peripheral area 21. The second power supply wire 380 may be disposed between ends of the first power supply wire 350 in the first peripheral area 21. Alternatively, the second power supply wire 380 may extend from the first peripheral area 21 to the display area 10, and have a lattice shape in the display area 10. The second power supply wire 380 may be electrically connected to the pad electrodes 470 in the first peripheral area 21. For example, the second power supply wire 380 may be electrically connected to pad electrodes 470 located at an inner side of the pad electrodes 470 connected to the first power supply wire 350 among the pad electrodes 470. A high power voltage may be applied to the second power supply wire 380, and the high power voltage may be provided to an anode electrode (for example, the lower electrode 290 in FIG. 6).

Further, the sealant 390 may be disposed in the peripheral area 20. When the peripheral area 20 has the hollow rectangular shape in a plan view, the sealant 390 disposed in the peripheral area 20 may also have a hollow rectangular shape in a plan view.

The first power supply wire 350 and the second power supply wire 380 may be disposed in the peripheral area 20 on a lower substrate 110 included in the organic light emitting diode display device 100 to be described below, and the sealant 390 may be disposed on the first power supply wire 350 and the second power supply wire 380. Here, the sealant 390 may include a first sealing portion 391 located in the first peripheral area 21, and a second sealing portion 392 located in the second peripheral area 22. The first sealing portion 391 may be integrally formed with the second sealing portion 392.

It is to be understood that in the figures, where a reference numeral is shown as pointing to a broken line box, the reference numeral is intended to represent what is shown in the broken line box, rather than the broken line box itself, except where expressly stated to the contrary.

The first power supply wire 350 may be overlapped between the lower substrate 110 and the sealant 390. The first power supply wire 350 located in the first peripheral area 21 may include a first protrusion (for example, the first protrusion 351 in FIG. 6) protruding from a first side of the first sealing portion 391 (for example, the inner side of the first sealing portion 391) in the first direction D1 directed from the pad area 60 to the display area 10. In addition, the first power supply wire 350, located in the first peripheral area 21, may include a second protrusion (for example, the second protrusion 352 in FIG. 6) protruding from a second side opposite the first side of the first sealing portion 391 (for example, the outer side of the first sealing portion 391) in the second direction D2 opposite to the first direction D1. For example, the first protrusion may be adjacent to the sub-pixel structure, and the second protrusion may be adjacent to the pad electrodes 470.

The first power supply wire 350, located in the second peripheral area 22, may include a third protrusion protruding from a first side of the second sealing portion 392 (for example, the inner side of the second sealing portion 392) in the direction from the second peripheral area 22 to the display area 10. Here, the third protrusion may be defined as a first end of the first power supply wire 350 located in the second peripheral area 22 (for example, the first end 353 in FIG. 7). For example, the first power supply wire 350 located in the second peripheral area 22 may include the first end and a second end opposite the first end (for example, the second end 354 in FIG. 7). For example, the first end may be adjacent to the sub-pixel structure, and the second end may be covered by the second sealing portion 392.

For example, the first power supply wire 350 may be divided into a first wire portion 361 located in the first peripheral area 21 and a second wire portion 362 located in the second peripheral area 22. The first width W1 extending in the first direction D1 of the first wire portion 361 of the first power supply wire 350 may be greater than the second width W2 extending in the direction from the second peripheral area 22 of the second wire portion 362 of the first power supply wire 350 to the display area 10. Although the first power supply wire 350 is divided into the first wire portion 361 and the second wire portion 362, the first and second wire portions 361 and 362 may be a single integrated unit.

The conventional organic light emitting diode display device may include a lower substrate, an upper substrate, first power supply wire, and a sealant, and the first power supply wire and the sealant may be disposed in the peripheral area on the lower substrate. Here, the first power supply wire might not overlap the sealant in a peripheral area (for example, the first peripheral area) adjacent to the pad area on the lower substrate. Thus, according to the conventional organic light emitting diode display device, the power supply wire may be disposed adjacent to the display area in the first peripheral area, and the sealant may be disposed adjacent to the pad area so as to be spaced apart from the power supply wire. In this case, the conventional organic light emitting diode display device may have a relatively large dead space in the first peripheral region. According to the organic light emitting diode display device 100, according to the exemplary embodiments of the present invention, the first power supply wire 350 at least partially overlaps the sealant 390 in the first peripheral area 21, so that the dead space of the organic light emitting diode display device 100 may be reduced. For example, a total length of the first peripheral area 21 and the pad area 60 extending in the first direction D1 (or the second direction D2) may be 2.22 mm or less.

Referring again to FIGS. 1 to 4, the pad electrodes 470 that are electrically connected to an external device 101 may be disposed in the pad area 60. In addition, connection electrodes may be disposed between the pad electrodes 470 and the first and second power supply wires 350 and 380. For example, the connection electrodes may electrically connect the pad electrodes 470 to the first and second power supply wires 350 and 380. In some exemplary embodiments, the lower substrate included in the organic light emitting diode display device 100 may have the same length in the lateral direction (for example, the third direction D3) in the display area 10, the peripheral area 20 and the pad area 60. In some exemplary embodiments, the lateral width of the pad area 60 may be smaller than the lateral widths of the display area 10 and the peripheral area 20.

The external device 101 may be electrically connected to the organic light emitting diode display device 100 through a flexible printed circuit board or a printed circuit board. For example, one side of the flexible printed circuit board may come into direct contact with the pad electrodes 470, and the other side of the flexible printed circuit board may come into direct contact with the external device 101. The external device 101 may provide a data signal, a gate signal, a light emission control signal, a gate initialization signal, an initialization voltage, a power supply voltage, and/or the like to the organic light emitting diode display device 100. In exemplary embodiments, a low power supply voltage (for example, the low power supply voltage ELVSS in FIG. 5) may be generated from the external device 101, and the low power supply voltage may be provided to the first power supply wire 350 through the flexible printed circuit board, the pad electrodes 470 and the connection electrodes. In addition, a high power supply voltage (for example, the high power supply voltage ELVDD in FIG. 5) may be generated from the external device 101, and the high power supply voltage may be provided to the second power supply wire 380 through the flexible printed circuit board, the pad electrodes 470 and the connection electrodes. Further, a drive integrated circuit may be mounted on the flexible printed circuit board. In some exemplary embodiments, the drive integrated circuit may be mounted on the organic light emitting diode display device 100 so as to be adjacent to the pad electrodes 470.

Figure 5:
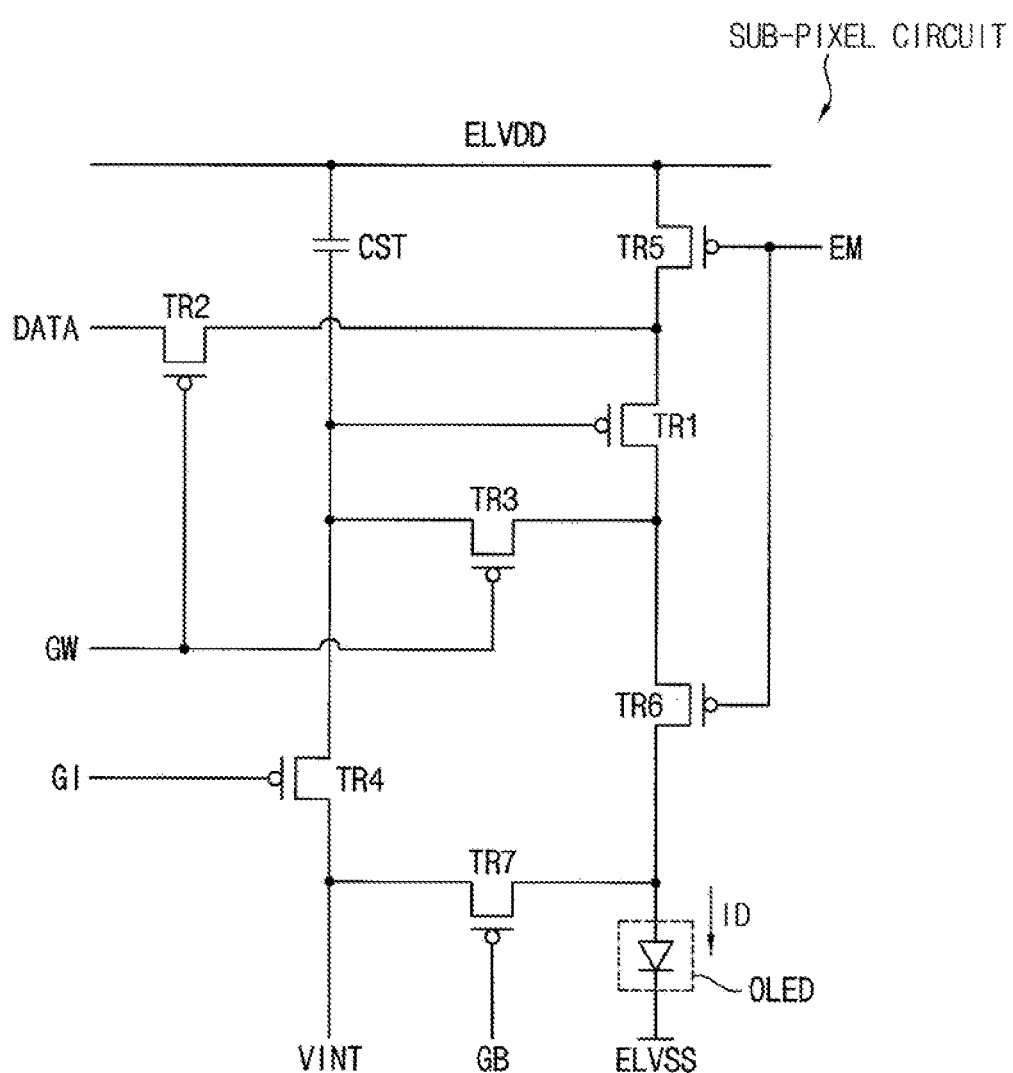
FIG. 5 is a circuit diagram illustrating a sub-pixel circuit and the organic light emitting diode disposed in the sub-pixel circuit area in FIG. 2.

FIG. 5 is a circuit diagram illustrating a sub-pixel circuit and the organic light emitting diode disposed in the sub-pixel circuit area in FIG. 2.

Referring to FIG. 5, the sub-pixel circuit SPC and the organic light emitting diode OLED may be disposed in each of the sub-pixel circuit areas 20 of the organic light emitting diode display device 100, in which one sub-pixel circuit SPC may include an organic light emitting diode OLED (for example, the sub-pixel structure 200 in FIG. 6), first to seventh transistors TR1, TR2, TR3, TR4, TR5, TR6, and TR7 (for example, the semiconductor element 250 in FIG. 6), a storage capacitor CST, a high power supply voltage ELVDD wire (for example, the second power supply wire 380 in FIGS. 2 and 3), a low power supply voltage ELVSS wire (for example, the first power supply wire 350 in FIGS. 2, 3, 6, and 7), an initialization voltage VINT wire, a data signal DATA wire, a gate signal GW wire, a gate initialization signal GI wire, an emission control signal EM wire, a diode initialization signal GB wire, and the like. As described above, the first transistor TR1 may correspond to a driving transistor, and the second to seventh transistors TR2, TR3, TR4, TR5, TR6, and TR7 may each correspond to a switching transistor. Each of the first to seventh transistors TR1, TR2, TR3, TR4, TR5, TR6, and TR7 may include a first terminal, a second terminal, a channel, and a gate terminal. In exemplary embodiments, the first terminal may be a source terminal and the second terminal may be a drain terminal. Alternatively, the first terminal may be a drain terminal, and the second terminal may be a source terminal.

The organic light emitting diode OLED may output light based on a driving current ID. The organic light emitting diode OLED may include the first terminal and the second terminal. In exemplary embodiments, the second terminal of the organic light emitting diode OLED may be supplied with the low power supply voltage ELVSS. For example, the first terminal of the organic light emitting diode OLED may be an anode terminal, and the second terminal of the organic light emitting diode OLED may be a cathode terminal. Alternatively, the first terminal of the organic light emitting diode OLED may be a cathode terminal, and the second terminal of the organic light emitting diode OLED may be an anode terminal. In exemplary embodiments, the anode terminal of the organic light emitting diode OLED may correspond to the lower electrode 290 in FIG. 6, and the cathode terminal of the organic light emitting diode OLED may correspond to the upper electrode 340 in FIG. 6.

The first transistor TR1 may generate the driving current ID. In exemplary embodiments, the first transistor TR1 may operate in a saturation area. In this case, the first transistor TR1 may generate the driving current ID based on a voltage difference between the gate terminal and the source terminal. In addition, a tone wedge may be expressed based on a size of the driving current ID supplied to the organic light emitting diode OLED. Alternatively, the first transistor TR1 may operate in a linear area. In this case, a tone wedge may be expressed based on the sum of times for supplying the driving current to the organic light emitting diode OLED within one frame.

The gate terminal of the second transistor TR2 may be supplied with the gate signal GW. The first terminal of the second transistor TR2 may be supplied with the data signal DATA. The second terminal of the second transistor TR2 may be connected to the first terminal of the first transistor TR1. For example, the gate signal GW may be provided from a gate driving unit, and the gate signal GW may be applied to the gate terminal of the second transistor TR2 through the gate signal GW wire. The second transistor TR2 may supply the data signal DATA to the first terminal of the first transistor TR1 during activation period of the gate signal GW. In this case, the second transistor TR2 may operate in the linear area.

The gate terminal of the third transistor TR33 may be supplied with the gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be provided from the gate driving unit, and the gate signal GW may be applied to the gate terminal of the third transistor TR3 through the gate signal GW wire. The third transistor TR3 may connect the gate terminal of the first transistor TR1 to the second terminal of the first transistor TR1 during activation period of the gate signal GW. In this case, the third transistor TR3 may operate in the linear area. For example, the third transistor TR3 may be diode-connected to the first transistor TR1 during activation period of the gate signal GW. Since the first transistor TR1 is diode-connected, a voltage difference equal to a threshold voltage of the first transistor TR1 may occur between the first terminal of the first transistor TR1 and the gate terminal of the first transistor TR1. As a result, the sum of a voltage by the voltage difference (for example, the threshold voltage) and a voltage of the data signal DATA supplied to the first terminal of the first transistor TR1 during activation period of the gate signal GW may be supplied to the gate terminal of the first transistor TR1. For example, the data signal DATA may be compensated for the threshold voltage of the first transistor TR1, and the compensated data signal DATA may be supplied to the gate terminal of the first transistor TR1. The compensation for the threshold voltage is performed, so that the driving current non-uniformity problem that is otherwise caused by a deviation of the threshold voltage of the first transistor TR1 can be solved.

An input terminal of the initialization voltage wire provided with the initialization voltage VINT may be connected to the first terminal of the fourth transistor TR4 and the first terminal of the seventh transistor TR7. An output terminal of the initialization voltage wire may be connected to the second terminal of the fourth transistor TR4 and the first terminal of the storage capacitor CST.

The gate terminal of the fourth transistor TR4 may be supplied with the gate initialization signal GI. The first terminal of the fourth transistor TR4 may be supplied with the initialization voltage VINT. The second terminal of the fourth transistor TR4 may be connected to the gate terminal of the first transistor TR1.

The fourth transistor TR4 may supply the initialization voltage VINT to the gate terminal of the first transistor TR1 during activation period of the gate initialization signal GI. In this case, the fourth transistor TR4 may operate in the linear area. For example, the fourth transistor TR4 may initialize the gate terminal of the first transistor TR1 into the initialization voltage VINT during activation period of the gate initialization signal GI. In exemplary embodiments, the initialization voltage VINT may have a voltage level sufficiently lower than a voltage level of the data signal DATA maintained by the storage capacitor CST in a previous frame, and the initialization voltage VINT may be supplied to the gate terminal of the first transistor TR1. In some exemplary embodiments, the initialization voltage may have a voltage level sufficiently higher than the voltage level of the data signal maintained by the storage capacitor in the previous frame, and the initialization voltage may be supplied to the gate terminal of the first transistor.

In exemplary embodiments, the gate initialization signal GI may be substantially the same as the gate signal GW before one horizontal time. For example, the gate initialization signal GI supplied to the sub-pixel circuit of the $n^{th}$ (where n is an integer of 2 or greater) row among the sub-pixel circuits included in the organic light emitting diode display device 100 may be substantially the same signal as the gate signal GW supplied to the sub-pixel circuit of the $(n-1)^{th}$. For example, the activated gate signal GW is supplied to the first sub-pixel circuit of the $(n-1)^{th}$ row among the sub-pixel circuits SPC, so that the activated gate initialization signal GI may be supplied to the first sub-pixel circuit of the $n^{th}$ row among the sub-pixel circuits SPC. As a result, the data signal DATA may be supplied to the $(n-1)^{th}$ sub-pixel circuit among the sub-pixel circuits, and simultaneously the gate terminal of the first transistor TR1 included in the sub-pixel circuit of the $n^{th}$ row among the sub-pixel circuits SPC may be initialized into the initialization voltage VINT.

The gate terminal of the fifth transistor TR5 may be supplied with a light emission control signal EM. The first terminal of the fifth transistor TR5 may be connected to the high power supply voltage ELVDD wire. The second terminal of the fifth transistor TR5 may be connected to the first terminal of the first transistor TR1. For example, the light emission control signal may be provided from a light emission control driving unit, and the light emission control signal EM may be applied to the gate terminal of the fifth transistor TR5 through the light emission control signal EM wire. The fifth transistor TR5 may supply the high power supply voltage ELVDD to the first terminal of the first transistor TR1 during activation period of the light emission control signal EM. The fifth transistor TR5 may also block the supply of the high power supply voltage ELVDD during inactivation period of the light emission control signal EM. In this case, the fifth transistor TR5 may operate in the linear area. The fifth transistor TR5 may supply the high power supply voltage ELVDD to the first terminal of the first transistor TR1 during the activation period of the light emission control signal EM, so that the first transistor TR1 may generate the driving current ID. In addition, the fifth transistor TR5 may block the supply of the high power supply voltage ELVDD during the inactivation period of the light emission control signal EM, so that the data signal DATA supplied to the first terminal of the first transistor TR1 may be supplied to the gate terminal of the first transistor TR1.

The gate terminal of the sixth transistor TR6 (for example, the semiconductor element 250 in FIG. 6) may be supplied with the light emission control signal EM. The first terminal of the sixth transistor TR6 may be connected to the second terminal of the first transistor TR1. The second terminal of the sixth transistor TR6 may be connected to the first terminal of the organic light emitting diode OLED. The sixth transistor TR6 may supply the driving current ID generated by the first transistor TR1 to the organic light emitting diode OLED during the activation period of the light emission control signal EM. In this case, the sixth transistor TR6 may operate in the linear area. For example, the sixth transistor TR6 may supply the driving current ID generated by the first transistor TR1 to the organic light emitting diode OLED during the activation period of the light emission control signal EM, so that the organic light emitting diode OLED may output light. In addition, the sixth transistor TR6 electrically isolates the first transistor TR1 and the organic light emitting diode OLED from each other during the inactivation period of the light emission control signal EM, so that the data signal DATA supplied to the second terminal of the first transistor TR1 (more precisely, the data signal compensated for the threshold voltage) may be supplied to the gate terminal of the first transistor TR1.

The gate terminal of the seventh transistor TR7 may supplied with a diode initialization signal GB. The first terminal of the seventh transistor TR7 may be supplied with the initialization voltage VINT. The second terminal of the seventh transistor TR7 may be connected to the first terminal of the organic light emitting diode OLED. The seventh transistor TR7 may supply the initialization voltage VINT to the first terminal of the organic light emitting diode OLED during the activation period of the diode initialization signal GB. In this case, the seventh transistor TR7 may operate in the linear area. For example, the seventh transistor TR7 may initialize the first terminal of the organic light emitting diode OLED into the initialization voltage VINT during activation period of the diode initialization signal GB.

Alternatively, the gate initialization signal GI may be substantially the same as the diode initialization signal GB. An operation of initializing the gate terminal of the first transistor TR1 and an operation of initializing the first terminal of the organic light emitting diode OLED might not affect each other. For example, the operation of initializing the gate terminal of the first transistor TR1 and the operation of initializing the first terminal of the organic light emitting diode OLED may be independent of each other. Accordingly, the diode initialization signal GB is not separately generated, so that the process may be made more efficient.

The storage capacitor CST may include a first terminal and a second terminal. The storage capacitor CST may be connected between the high power supply voltage ELVDD wire and the gate terminal of the first transistor TR1. For example, the first terminal of the storage capacitor CST may be connected to the gate terminal of the first transistor TR1, and the second terminal of the storage capacitor CST may be connected to the high power supply voltage ELVDD wire. The storage capacitor CST may maintain a voltage level of the gate terminal of the first transistor TR1 during inactivation period of a scan signal GW. The inactivation period of the scan signal GW may include an activation period of the light emission control signal EM, and a driving current ID generated by the first transistor TR1 during the activation period of the light emission control signal EM may be supplied to the organic light emitting diode OLED. Accordingly, the driving current ID generated by the first transistor TR1 may be supplied to the organic light emitting diode OLED based on the voltage level maintained by the storage capacitor CST.

Although the sub-pixel circuit SPC of the present invention has been described as including seven transistors and one storage capacitor, the configuration of the present invention is not limited thereto. For example, the sub-pixel circuit SPC may be configured to include at least one transistor and at least one storage capacitor.

Figure 6:
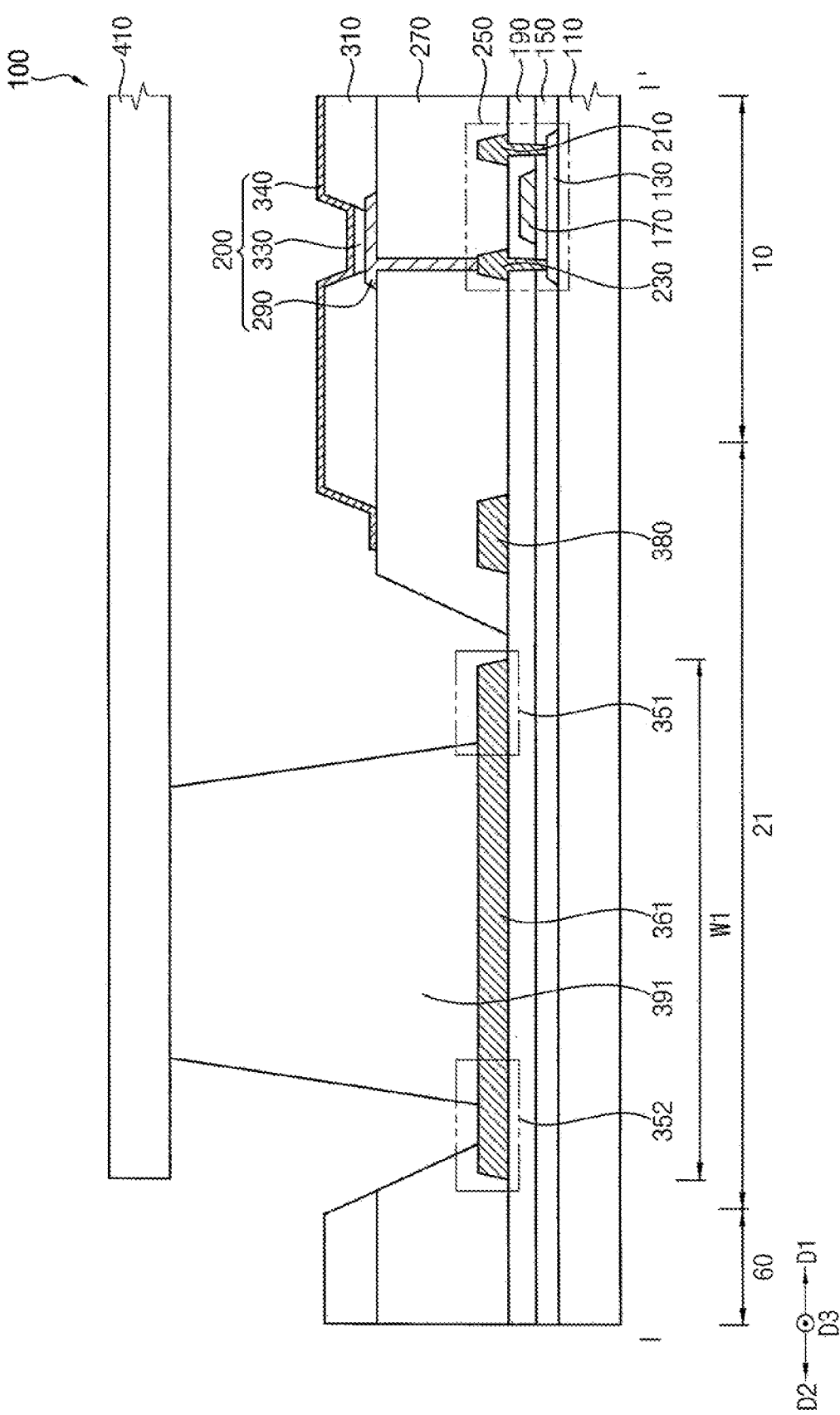
FIG. 6 is a cross-sectional view taken along line I-I' in FIG. 2.
Figure 7:
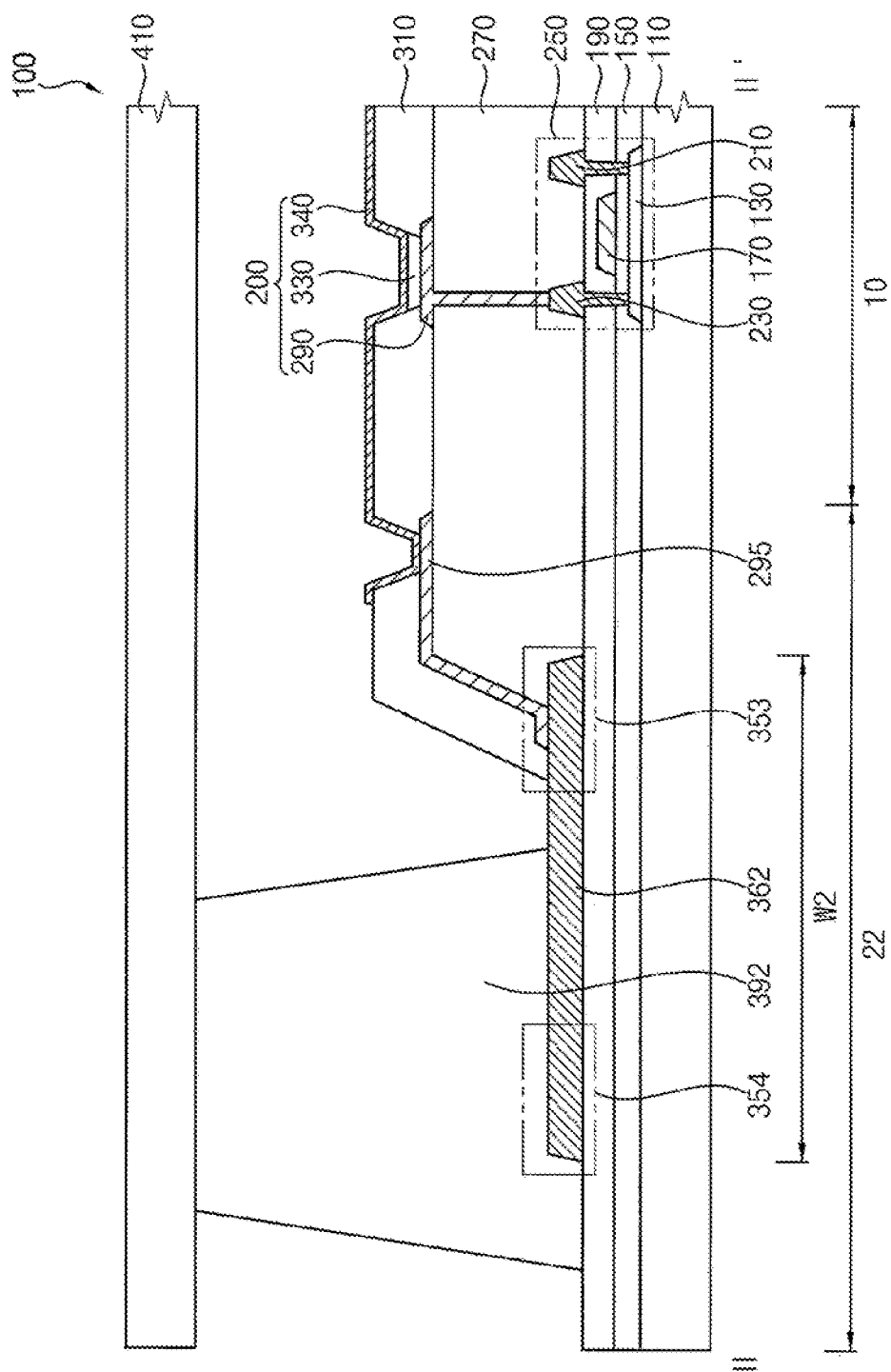
FIG. 7 is a cross-sectional view taken along line II-II' in FIG. 2.

FIG. 6 is a cross-sectional view taken along line I-I' in FIG. 2. FIG. 7 is a cross-sectional view taken along line II-II' in FIG. 2.

Referring to FIGS. 2, 3, 6 and 7, the organic light emitting diode display device 100 may include a lower substrate 110, a semiconductor device 250, a first power supply wire 350, a second power supply wire 380, a planarization layer 270, a connection pattern 295, a pixel defining layer 310, a sub-pixel structure 200, a sealant 390, an upper substrate 410, and the like. Here, the semiconductor device 250 may include an active layer 130, a gate insulating layer 150, a gate electrode 170, an interlayer insulating layer 190, a source electrode 210, and a drain electrode 230. The sub-pixel structure 200 may include a lower electrode 290, a light emitting layer 330, and an upper electrode 340. In exemplary embodiments, the sealant 390 may be divided into a first sealing portion 391 and a second sealing portion 392, and the first power supply wire 350 may be divided into a first wire portion 361 at least partially overlapping the first sealing portion 391 and a second wire portion 362 at least partially overlapping the second sealing portion 392.

The lower substrate 110 may include a transparent or opaque material. The lower substrate 110 may include a quartz substrate, a synthetic quartz substrate, a calcium fluoride substrate, a fluorine-doped (F-doped) quartz substrate, a sodalime glass substrate, a non-alkali glass substrate, and/or the like. As described above, the organic light emitting diode display device 100 includes a display area 10, a peripheral area 20 including a first peripheral area 21 and a second peripheral area 22, and a pad area 60. Accordingly, the lower substrate 110 may also be divided into a display area 10, a first peripheral area 21, a second peripheral area 22, and a pad area 60. Alternatively, the lower substrate 110 may be formed of a transparent resin substrate having flexibility. An example of the transparent resin substrate that can be used for the lower substrate 110 includes a polyimide substrate.

A buffer layer may be disposed on the lower substrate 110. The buffer layer may be disposed entirely on the lower substrate 110. The buffer layer may prevent metal atoms or impurities from diffusing from the lower substrate 110 to the semiconductor element 250 and the sub-pixel structure 200, and may enable a substantially uniform active layer 130 to be obtained by adjusting the rate of heat transfer during crystallization process for forming the active layer 130. In addition, when a surface of the lower substrate 110 is not uniform, the buffer layer may serve to flatten out of the surface of the lower substrate 110. Depending on a type of substrate 110, at least two buffer layers may be provided on the substrate 110, or the buffer layer might not be disposed thereon. For example, the buffer layer may include an organic material or an inorganic material.

The active layer 130 may be disposed in the display area 10 on the lower substrate 110. For example, the active layer 130 may include an oxide semiconductor, an inorganic semiconductor (such as amorphous silicon and poly silicon), an organic semiconductor, and/or the like. The active layer 130 may have source, drain, and channel areas.

The gate insulating layer 150 may be disposed on the active layer 130. The gate insulating layer 150 may cover the active layer 130 in the display area 10 on the lower substrate 110, and be disposed entirely on the lower substrate 110. In exemplary embodiments, the gate insulating layer 150 may sufficiently cover the active layer 130 on the lower substrate 110, and have a substantially planarized top surface without generating a step around the active layer 130. Alternatively, the gate insulating layer 150 may cover the active layer 130 on the lower substrate 110, and have a uniform thickness along a profile of the active layer 130. The gate insulating layer 150 may include silicon compound, metal oxide, and/or the like. For example, the gate insulating layer 150 may include a silicon oxide (SiOx), a silicon nitride (SiNx), a silicon oxynitride (SiOxNy), a silicon oxycarbide (SiOxCy), a silicon carbonitride (SiCxNy), an aluminum oxide (AlOx), an aluminum nitride (AlNx), a tantalum oxide (TaOx), a hafnium oxide (HfOx), a zirconium oxide (ZrOx), a titanium oxide (TiOx), and/or the like. Alternatively, the gate insulating layer 150 may have a multi-layer structure having a plurality of insulating layers including different materials. In some exemplary embodiments, the gate insulating layer 150 may be disposed exclusively in the display area 10, and might not be disposed in either the peripheral area 20 or the pad area 60.

The gate electrode 170 may be disposed on the gate insulating layer 150. For example, the gate electrode 170 may be disposed on a portion of the gate insulating layer 150, below which the active layer 130 is located. The gate electrode 170 may include a metal, an alloy, a metal nitride, a conductive metal oxide, a transparent conductive material, and/or the like. These may be used alone or in combination with each other. Alternatively, the gate electrode 170 may have a multi-layer structure including a plurality of layers.

An interlayer insulating layer 190 may be disposed on the gate electrode 170. The interlayer insulating layer 190 may cover the gate electrode 170 in the display area 10 on the gate insulating layer 150, and be disposed entirely on the gate insulating layer 150. In exemplary embodiments, the interlayer insulating layer 190 may sufficiently cover the gate electrode 170 on the gate insulating layer 150, and have a substantially planarized top surface without generating a step around the gate electrode 170. Alternatively, the interlayer insulating layer 190 may have a uniform thickness along a profile of the gate electrode 170 while covering the gate electrode 170 on the gate insulating layer 150. The interlayer insulating layer 190 may include silicon compound, metal oxide, or the like. Alternatively, the interlayer insulating layer 190 may have a multi-layer structure having a plurality of insulating layers including different materials. In some exemplary embodiments, the interlayer insulating layer 190 may be disposed exclusively in the display area 10, and might not be disposed in the peripheral area 20 and the pad area 60.

The source electrode 210 and the drain electrode 230 may be disposed in the display area on the interlayer insulating layer 190. The source electrode 210 may be connected to the source of the active layer 130 through a contact hole formed by removing first portions of the gate insulating layer 150 and the interlayer insulating layer 190, and the drain electrode 230 may be connected to the drain of the active layer 130 through a contact hole formed by removing the second portion of the gate insulating layer 150 and the interlayer insulating layer 190. Each of the source electrode 210 and the drain electrode 230 may include a metal, an alloy, a metal nitride, a conductive metal oxide, a transparent conductive material, and/or the like. These may be used alone or in combination with each other. Alternatively, each of the source electrode 210 and the drain electrode 230 may have a multi-layer structure including a plurality of layers. Accordingly, a semiconductor device 250, which includes the active layer 130, the gate insulating layer 150, the gate electrode 170, the interlayer insulating layer 190, the source electrode 210 and the drain electrode 230, may be disposed.

Although the organic light emitting diode display device 100 has been described as including one transistor (such as a semiconductor element 250), the configuration of the present invention is not limited thereto. For example, the organic light emitting diode display device 100 may be configured to include at least two transistors and at least one capacitor.

In addition, although the semiconductor element 250 has been described as having an upper gate structure, the configuration of the present invention is not limited thereto. For example, the semiconductor element 250 may have a bottom gate structure and/or a double gate structure.

Although the semiconductor element 250 in FIG. 6 and the semiconductor element 250 in FIG. 7 have the same reference numeral for convenience of description, the semiconductor element 250 in FIG. 6 and the semiconductor element 250 in FIG. 7 may be different semiconductor elements. For example, the semiconductor element 250 in FIG. 6 may be a semiconductor element adjacent to the first peripheral area 21, and the semiconductor element 250 in FIG. 7 may be a semiconductor element adjacent to the second peripheral area 22.

A first power supply wire 350 may be disposed in the peripheral area 20 on the interlayer insulating layer 190. For example, the first power supply wire 350 may be disposed on the interlayer insulating layer 190 so as to be spaced apart from the source electrode 210 and the drain electrode 230. In exemplary embodiments, a low power supply voltage may be applied to the first power supply wire 350. For example, the first power supply wire 350 may be electrically connected to at least one of the pad electrodes 470, and supplied with the low power supply voltage (for example, the low power supply voltage ELVSS in FIG. 5) from the external device 101. In addition, the low power supply voltage may be provided to an upper electrode 340.

For example, as shown in FIG. 6, the first power supply wire 350 (for example, the first wire portion 361) may be overlapped between the interlayer insulating layer 190 and the first sealing portion 391. the first power supply wire 350, located in the first peripheral area 21, may include a first protrusion 351 protruding from a first side of the first sealing portion 391 in the first direction D1, and a second protrusion 352 protruding from a second side of the first sealing portion 391 in the second direction D2. For example, the first protrusion 351 may be adjacent to the sub-pixel structure 200, and the second protrusion 352 may be adjacent to the pad electrodes 470 (see FIGS. 2 and 3). In exemplary embodiments, the first power supply wire 350 (for example, the first wire portion 361) located in the first peripheral area 21 may have a first width W1. In addition, the first protrusion 351 may be exposed, and spaced apart from the planarization layer 270 located in the display area 10 adjacent to the first peripheral area 21. The second protrusion 352 may be electrically connected to the pad electrodes 470, and may be covered by the planarization layer 270 adjacent to the pad area 60. Further, the connection pattern 295 might not be disposed in the first peripheral area 21 on the lower substrate 110, and the first wire portion 361 might not come into direct contact with the connection pattern 295. Alternatively, the connection pattern 295 may be disposed in the first peripheral area 21, and the connection pattern 295 may electrically connect the upper electrode 340 to the first wire portion 361.

In addition, as shown in FIG. 7, the first power supply wire 350 (for example, the second wire portion 362) may be overlapped between the interlayer insulating layer 190 and the second sealing portion 392. The first power supply wire 350 located in the second peripheral area 22 may include a third protrusion protruding from a first side of the second sealing portion 392 in the third direction D3. Here, the third protrusion may be defined as a first end 353 of the first power supply wire 350 located in the second peripheral area 22. For example, the first power supply wire 350 located in the second peripheral area 22 may include the first end 353 and a second end 354. For example, the first end 353 may be adjacent to the sub-pixel structure 200, and the second end 354 may at least partially overlap the second sealing portion 392. In exemplary embodiments, the first power supply wire 350 (for example, the second wire portion 362) located in the second peripheral area 22 may have a second width W2 that is less than the first width W1. In addition, the third protrusion 353 may be covered by the planarization layer 270 and the pixel defining layer 310 located in the display area 10 adjacent to the second peripheral area 22, and the second end 354 may be covered by the second sealing portion 392. For example, the first and second ends 353 and 354 might not be exposed. Further, the first end 353 may come into direct contact with the connecting pattern 295.

The first power supply wire 350 may absorb and/or reflect energy of laser light irradiating the sealant 390 to allow the lower substrate 110 and the upper substrate 410 to be sealed and coupled to each other, and may contribute to a state change in a material of the sealant 390. For example, the first power supply wire 350 may function as a wire capable of providing the low power supply voltage and a metal layer capable of absorbing and reflecting the energy of the laser light. The first power supply wire 350 may include a metal, an alloy, a metal nitride, a conductive metal oxide, a transparent conductive material, and/or the like. For example, the first power supply wire 350 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Jr), an alloy containing aluminum, aluminum nitride (AlNx), an alloy containing silver, tungsten nitride (WNx), an alloy containing copper, an alloy containing molybdenum, titanium nitride (TiNx), chromium nitride (CrNx), tantalum nitride (TaNx), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), and/or the like. These may be used alone or in combination with each other. Alternatively, the first power supply wire 350 may have a multi-layer structure including a plurality of layers.

The second power supply wire 380 may be disposed in the first peripheral area 21 on the interlayer insulating layer 190. For example, the second power supply wire 380 may be disposed between the first power supply wire 350 and the source and drain electrodes 210 and 230 on the interlayer insulating layer 190. In exemplary embodiments, the high power supply voltage may be applied to the second power supply wire 380. For example, the second power supply wire 380 may be electrically connected to at least one of the pad electrodes 470, and supplied with the high power supply voltage (for example, the high power supply voltage ELVDD in FIG. 5) from the external device 101. In addition, the high power supply voltage may be provided to the lower electrode 290.

The second power supply wire 380 may include a metal, an alloy, a metal nitride, a conductive metal oxide, a transparent conductive material, and/or the like. These may be used alone or in combination with each other. Alternatively, the second power supply wire 380 may have a multi-layer structure including a plurality of layers. In exemplary embodiments, the second power supply wire 380, the first power supply wire 350, the source electrode 210, and the drain electrode 230 may be located on the same layer.

The planarization layer 270 may be disposed on the interlayer insulating layer 190, the second power supply wire 380, a part of the first power supply wire 350, the source electrode 210, and the drain electrode 230. As described above, the planarization layer 270 located in the display area 10 adjacent to the first peripheral area 21 may be spaced apart from the first power supply wire 350, and may cover the second power supply wire 380. The planarization layer 270 located in the first peripheral area 21 adjacent to the pad area 60 may cover the second protrusion 352. In addition, the planarization layer 270 located in the display area 10 adjacent to the second peripheral area 22 may cover the third protrusion 353. Alternatively, the planarization layer 270 might not be disposed in the pad area 60, and the second protrusion 352 may be exposed.

The planarization layer 270 located in the display area 10 may be relatively thick to sufficiently cover the source and drain electrodes 210 and 230. In this case, the planarization layer 270 may have a substantially planarized top surface, and a planarization process may be added with respect to the planarization layer 270 to implement the above planarized top surface of the planarization layer 270. A part of the top surface of the drain electrode 230 may be exposed through the contact hole formed by removing a part of the planarization layer 270. The planarization layer 270 may include an organic material or an inorganic material. In exemplary embodiments, the planarization layer 270 may include an organic material. For example, the planarization layer 270 may include photoresist, polyacryl-based resin, polyimide-based resin, polyimide-based resin, siloxane-based resin, acryl-based resin, epoxy-based resin, and/or the like.

The lower electrode 290 may be disposed in the display area 10 on the planarization layer 270. The lower electrode 290 may be connected to the drain electrode 230 after passing through the contact hole of the planarization layer 270. In addition, the lower electrode 290 may be electrically connected to the semiconductor element 250. The lower electrode 290 may include a metal, an alloy, a metal nitride, a conductive metal oxide, a transparent conductive material, and the like. These may be used alone or in combination with each other. Alternatively, the lower electrode 290 may have a multi-layer structure including a plurality of layers.

The connection pattern 295 may be disposed in the peripheral area 20 on a part of the first power supply wire 350 and a part of the planarization layer 270. In exemplary embodiments, the connection pattern 295 may come into direct contact with the top surface of the planarization layer 270, a side wall portion of the planarization layer 270, and a part of the top surface of the third protrusion 353 in the second peripheral area 22. For example, one side of the connection pattern 295 may come into direct contact with the upper electrode 340, the other side of the connection pattern 295 may come into direct contact with the first power supply wire 350, and the connection pattern 295 may electrically connect the second wire portion 362 to the upper electrode 340. In addition, the connection pattern 295 might not be disposed in the first peripheral area 21. Alternatively, the connection pattern 295 may be disposed in the first peripheral area 21 and electrically connected to the first wire portion 361. The connection pattern 295 may include a metal, an alloy, a metal nitride, a conductive metal oxide, a transparent conductive material, and the like. These may be used alone or in combination with each other. Alternatively, the connection pattern 295 may have a multi-layer structure including a plurality of layers. In exemplary embodiments, the lower electrode 290 and the connection pattern 295 may be located on the same layer.

The pixel defining layer 310 may be disposed on a part of the lower electrode 290, a part of the connection pattern 295 and the planarization layer 270. The pixel defining layer 310 may cover both sides of the lower electrode 290 and at least a single side of the connection pattern 295, and expose a part of the top surface of the lower electrode 290. In exemplary embodiments, the pixel defining layer 310 adjacent to the first peripheral area 21 might not come into direct contact with the first wire portion 361, and the pixel defining layer 310 adjacent to the second peripheral area 22 may come into direct contact with a part of the second wire portion 362. Alternatively, the pixel defining layer 310 might not be disposed in the pad area 60. The pixel defining layer 310 may be formed of an organic material or an inorganic material. In exemplary embodiments, the pixel defining layer 310 may include an organic material.

The light emitting layer 330 may be disposed on the lower electrode 290 exposed by the pixel defining layer 310. The light emitting layer 330 may be formed using at least one of light emitting materials configured to emit color light (such as red light, green light, and blue light) that are different by sub-pixels. Alternatively, the light emitting layer 330 may be formed by laminating a plurality of light emitting materials capable of generating different color light such as red light, green light and blue light, such that white light may be emitted thereby. In this case, a color filter may be disposed on the light emitting layer 330 (for example, the color filter is disposed on a bottom or top surface of the upper substrate 410 to at least partially overlap the light emitting layer 330). The color filter may include a red color filter, a green color filter, and/or a blue color filter. Alternatively, the color filter also may include a yellow color filter, a cyan color filter, and a magenta color filter. The color filter may include photo-sensitive resin, color photoresist, and/or the like.

The upper electrode 340 may be disposed on a part of the connection pattern 295, on the pixel defining layer 310, and on the light emitting layer 330. In exemplary embodiments, the upper electrode 340 may cover the light emitting layer 330 and the pixel defining layer 310, and extend from the display area 10 to the peripheral area 20. In exemplary embodiments, the upper electrode 340 located in the second peripheral area 22 may come into direct contact with a part of the top surface of the connection pattern 295, and the connection pattern 295 may be electrically connected to the upper electrode 340. In addition, the upper electrode 340 located in the first peripheral area 21 might not come into direct contact with the first wire portion 361. The upper electrode 340 may include a metal, an alloy, a metal nitride, a conductive metal oxide, a transparent conductive material, and the like. These may be used alone or in combination with each other. Alternatively, the upper electrode 340 may have a multi-layer structure including a plurality of layers. Accordingly, the pixel structure 200 including the lower electrode 290, the light emitting layer 330, and the upper electrode 340 may be disposed.

Although the sub-pixel structure 200 of FIG. 6 and the sub-pixel structure 200 of FIG. 7 have been assumed to have the same reference numeral for convenience of description, the sub-pixel structure 200 of FIG. 6 and the sub-pixel structure 200 of FIG. 7 may be different sub-pixel structures. For example, the sub-pixel structure 200 of FIG. 6 may be a sub-pixel structure disposed adjacent to the peripheral area 21, and the sub-pixel structure 200 of FIG. 7 may be a sub-pixel structure disposed adjacent to the second peripheral area 22.

The sealant 390 may be disposed in the peripheral area 20 on the first power supply wire 350. For example, the sealant 390 may be disposed in the peripheral area 20 between the lower substrate 110 and the upper substrate 410. The top surface of the sealant 390 may come into direct contact with the bottom surface of the upper substrate 410, and the bottom surface of the sealant 390 may come into direct contact with a part of the interlayer insulating layer 190 and/or a part of the first power supply wire 350.

For example, as shown in FIG. 6, the first sealing portion 391 may be disposed only on the first power supply wire 350. For example, the bottom surface of the first sealing portion 391 may come into direct contact with the top surface of the first power supply wire 350.

In addition, as shown in FIG. 7, the second sealing portion 392 may be disposed on the first power supply wire 350 and the interlayer insulating layer 190 at the same time. For example, the bottom surface of the second sealing portion 392 may come into direct contact with the upper surface of the first power supply wire 350 and the top surface of the interlayer insulating layer 190 at the same time.

The sealant 390 may include a frit or the like. In addition, the sealant 390 may further include a photocurable material. For example, the sealant 390 may include a mixture of an organic material and a photocurable material, and the sealant 390 may be obtained by irradiating the mixture with ultraviolet rays (UV), laser light, visible light, and/or the like and curing the mixture thereby. The photocurable material included in the sealant 390 may include epoxy acrylate-based resin, polyester acrylate-based resin, urethane acrylate-based resin, polybutadiene acrylate-based resin, silicon acrylate-based resin, alkyl acrylate-based resin, and/or the like.

For example, the mixture of the organic material and the photocurable material may be irradiated with laser light. Upon the irradiation of the mixture, the mixture may be changed from a solid state to a liquid state, and the mixture in the liquid state may be cured into the solid state after a predetermined time. The upper substrate 410 may be sealed and coupled to the lower substrate 110 according to the state change of the mixture. The first power supply wire 350 of the peripheral area 20 may absorb and/or reflect the energy of the laser light during the exposure. The energy reflected and absorbed by the first power supply wire 350 may be transferred to the mixture, thereby contributing to the state change of the mixture.

Although the sealant 390 has a trapezoidal shape in which a width of the top surface is smaller than a width of the bottom surface, the configuration of the present invention is not limited thereto. For example, the sealant 390 may have a trapezoidal shape having the width of the top surface greater than the width of the bottom surface, a rectangular shape, a square shape, or the like.

The upper substrate 410 may be disposed on the sealant 390 and the upper electrode 340. The upper substrate 410 may include substantially the same material as the lower substrate 110. For example, the upper substrate 410 may include a quartz substrate, a synthetic quartz substrate, a calcium fluoride substrate, a fluorine-doped (F-doped) quartz substrate, a sodalime glass substrate, a non-alkali glass substrate, and/or the like. In some exemplary embodiments, the upper substrate 410 may be formed using a transparent inorganic material or flexible plastic. For example, the upper substrate 410 may be formed of a transparent resin substrate having flexibility. Accordingly, an organic light emitting diode display device 100 may be provided.

In the organic light emitting diode display device 100, according to exemplary embodiments of the present invention, the first power supply wire 350 might not come into direct contact with the planarization layer 270, so that heat generated by the laser light might not be transferred to the planarization layer 270. Accordingly, the organic light emitting diode display device 100 can prevent the sub-pixel structure 200 from being damaged.

In addition, the first power supply wire 350 at least partially overlaps the sealant 390 in the first peripheral area 21, so that the dead space of the organic light emitting diode display device 100 may be reduced. Accordingly, the organic light emitting diode display device 100 can function as a full screen display device.

In addition, the first power supply wire 350 disposed in the first peripheral area 21 may have the first width W1 that is relatively large, so that a wire resistance can be reduced. Accordingly, the driving voltage and the power consumption of the organic light emitting diode display device 100 can be reduced.

Further, the first power supply wire 350 may function as a wire capable of providing the low power supply voltage and a metal layer capable of absorbing and reflecting the energy of the laser light at the same time. Accordingly, a metal layer capable of absorbing and reflecting the energy of the laser light may be omitted, so that the manufacturing cost of the organic light emitting diode display device 100 can be reduced.

FIGS. 8 to 17 are cross-sectional views showing a method of manufacturing an organic light emitting diode display device according to exemplary embodiments of the present invention. For example, FIGS. 8, 10, 12, 14, and 16 are cross-sectional views showing the first peripheral area 21 and the display area 10 and the pad area 60 that are adjacent to the first peripheral area 21, and FIGS. 9, 11, 13, 15 and 17 are cross-sectional views showing the second peripheral area 22 and the display area 10 adjacent to the second peripheral area 22.

Figure 8:
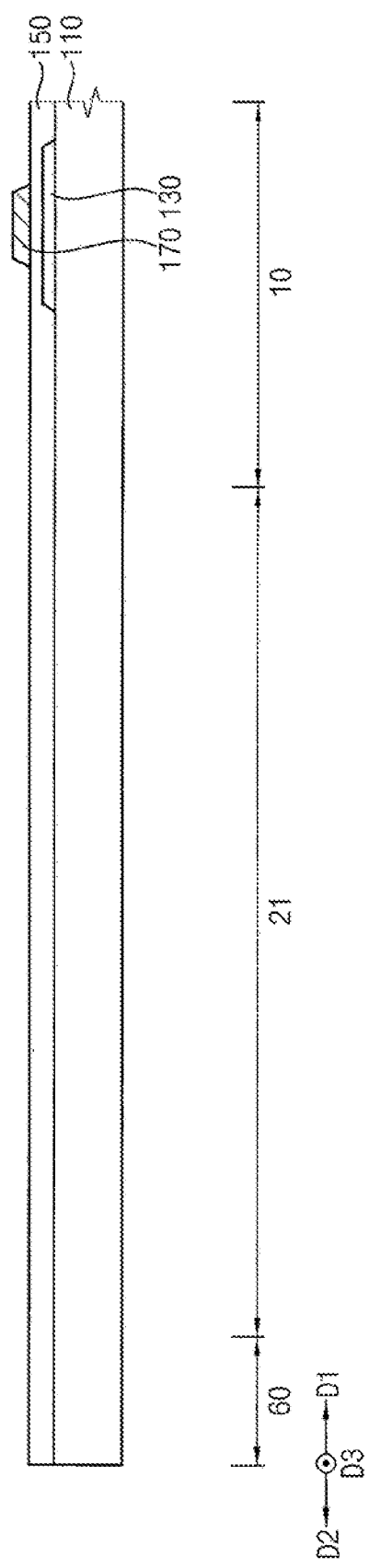
FIGS. 8 to 17 are cross-sectional views illustrating a method of manufacturing an organic light emitting diode display device according to exemplary embodiments of the present invention.
Figure 9:
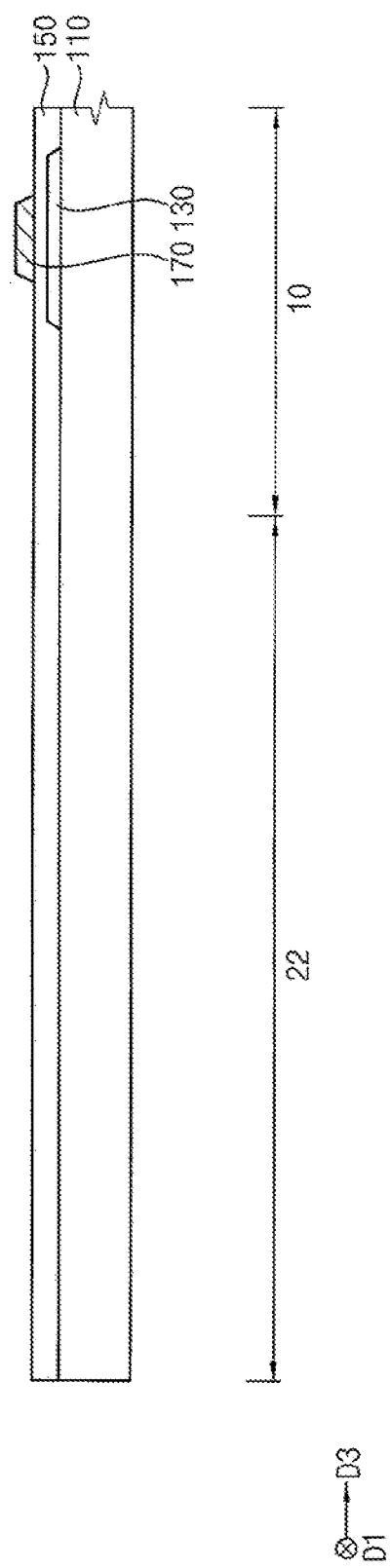

Referring to FIGS. 8 and 9, the lower substrate 110 may include a transparent or opaque material. The lower substrate 110 may be formed using a quartz substrate, a synthetic quartz substrate, a calcium fluoride substrate, a fluorine-doped (F-doped) quartz substrate, a sodalime glass substrate, a non-alkali glass substrate, and/or the like. In exemplary embodiments, the lower substrate 110 may include the display area 10, the first peripheral area 21, and the second peripheral area 22, and may include a peripheral area 20 at least partially surrounding the display area 10 and a pad area 60 located on one side of the peripheral area 20.

A buffer layer may be formed on the lower substrate 110. The buffer layer may be formed entirely on the lower substrate 110. Depending on a type of substrate 110, at least two buffer layers may be provided on the substrate 110, or the buffer layer might not be formed thereon. For example, the buffer layer may be formed by using an organic material or an inorganic material.

Active layers 130 may be formed in the display area 10 on the lower substrate 110. For example, each of the active layers 130 may be formed using an oxide semiconductor, an inorganic semiconductor, an organic semiconductor, or the like. Each of the active layers 130 may have a source, a drain, and a channel.

A gate insulating layer 150 may be formed on the active layers 130. The gate insulating layer 150 may cover the active layers 130 in the display area 10 on the lower substrate 110, and be formed entirely on the lower substrate 110. In exemplary embodiments, the gate insulating layer 150 may sufficiently cover the active layers 130 on the lower substrate 110, and have a substantially planarized top surface without generating a step around the active layers 130. Alternatively, the gate insulating layer 150 may be formed to have a uniform thickness along profiles of the active layers 130 while covering the active layers 130 on the lower substrate 110. The gate insulating layer 150 may be formed by using silicon compound, metal oxide, or the like. For example, the gate insulating layer 150 may include silicon oxide, silicon nitride, silicon oxynitride, silicon oxycarbide, silicon carbonitride, aluminum oxide, aluminum nitride, tantalum oxide, hafnium oxide, zirconium oxide, titanium oxide, and/or the like. Alternatively, the gate insulating layer 150 may have a multi-layer structure having a plurality of insulating layers including different materials. In some exemplary embodiments, the gate insulating layer 150 may be formed only in the display area 10, and might not be formed in the peripheral area 20 or the pad area 60.

Figure 10:
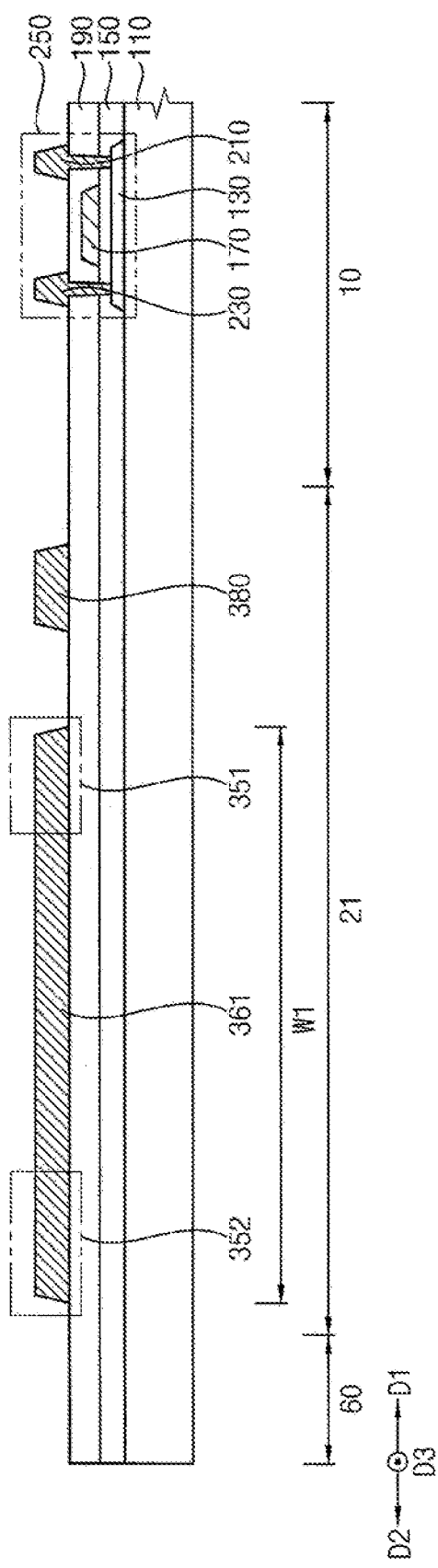
Figure 11:
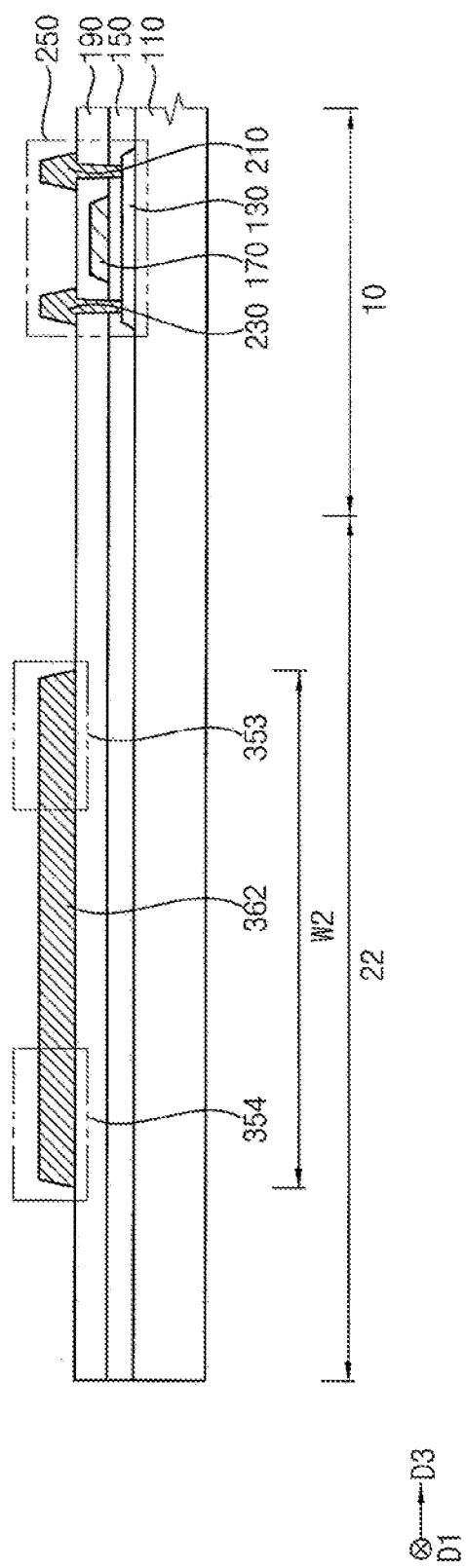

Referring to FIGS. 10 and 11, the gate electrodes 170 may be formed on the gate insulating layer 150. For example, the gate electrodes 170 may be formed on portions of the gate insulating layer 150 under which the active layers 130 are located. Each of the gate electrodes 170 may be formed by using a metal, an alloy, a metal nitride, a conductive metal oxide, a transparent conductive material, or the like. These may be used alone or in combination with each other. Alternatively, each of the gate electrodes 170 may have a multi-layer structure including a plurality of layers.

An interlayer insulating layer 190 may be formed on the gate electrodes 170. The interlayer insulating layer 190 may cover the gate electrodes 170 in the display area 10 on the gate insulating layer 150, and be formed entirely on the gate insulating layer 150. In exemplary embodiments, the interlayer insulating layer 190 may sufficiently cover the gate electrodes 170 on the gate insulating layer 150, and have a substantially planarized top surface without generating a step around the gate electrodes 170. Alternatively, the interlayer insulating layer 190 be formed to have a uniform thickness along the profiles of the gate electrodes 170 while covering the gate electrodes 170 on the gate insulating layer 150. The interlayer insulating layer 190 may be formed by using silicon compound, metal oxide, or the like. Alternatively, the interlayer insulating layer 190 may have a multi-layer structure having a plurality of insulating layers including different materials. In some exemplary embodiments, the interlayer insulating layer 190 may be formed only in the display area 10, and might not be formed in the peripheral area 20 and the pad area 60.

Source electrodes 210 and drain electrodes 230 may be formed in the display area 10 on the interlayer insulating layer 190. The source electrodes 210 may be connected to the sources of the active layers 130 through contact holes formed by removing first portions of the gate insulating layer 150 and the interlayer insulating layer 190, respectively. The drain electrodes 230 may be connected to the drains of the active layer 130 through contact holes formed by removing second portions of the gate insulating layer 150 and the interlayer insulating layer 190. Each of the source electrodes 210 and the drain electrodes 230 may be formed by using a metal, an alloy, a metal nitride, a conductive metal oxide, a transparent conductive material, or the like. These may be used alone or in combination with each other. Alternatively, each of the source electrodes 210 and the drain electrodes 230 may have a multi-layer structure including a plurality of layers. Accordingly, semiconductor devices 250, which includes the active layers 130, the gate insulating layer 150, the gate electrodes 170, the interlayer insulating layer 190, the source electrodes 210 and the drain electrodes 230, may be formed.

A first power supply wire 350 may be formed in the peripheral area 20 on the interlayer insulating layer 190. For example, the first power supply wire 350 may be formed on the interlayer insulating layer 190 so as to be spaced apart from the source electrode 210 and the drain electrode 230. The first power supply wire 350 may be formed along a shape of the peripheral area 20, and may have a substantially hollow rectangular planar shape (or a rectangular planar shape having an opening that exposes the display area 10). In exemplary embodiments, the first power supply wire 350 may have a different width in the peripheral area 20. For example, a width of the first power supply wire 350 located in the first peripheral area 21 may be different from a width of the first power supply wire 350 located in the second peripheral area 22 (see FIG. 2). In addition, the first power supply wire 350 may be integrally formed in the peripheral area 20.

As shown in FIG. 10, the first power supply wire 350 (for example, the first wire portion 361) located in the first peripheral area 21 may have a first width W1 extending in the first direction D1, and may have a first protrusion 351 and a second protrusion 352. In addition, as shown in FIG. 11, the first power supply wire 350 (for example, the second wire portion 362) located in the second peripheral area 22 may have a second width W2 extending in the third direction D3 (for example, in the direction from the second peripheral area 22 to the display area 10), and have a first end 353 and a second end 354. The first width W1 may be greater than the second width W2.

The first power supply wire 350 may be formed by using a metal, an alloy, a metal nitride, a conductive metal oxide, a transparent conductive material, or the like. For example, the first power supply wire 350 may include gold, silver, aluminum, platinum, nickel, titanium, palladium, magnesium, calcium, lithium, chromium, tantalum, tungsten, copper, molybdenum, scandium, neodymium, iridium, an alloy containing aluminum, aluminum nitride, an alloy containing silver, tungsten nitride, an alloy containing copper, an alloy containing molybdenum, titanium nitride, tantalum nitride, strontium ruthenium oxide, zinc oxide, indium tin oxide, tin oxide, indium oxide, gallium oxide, indium zinc oxide, and/or the like. These may be used alone or in combination with each other. Alternatively, the first power supply wire 350 may have a multi-layer structure including a plurality of layers.

A second power supply wire 380 may be formed in the first peripheral area 21 on the interlayer insulating layer 190. For example, the second power supply wire 380 may be formed between the first power supply wire 350 and the source and drain electrodes 210 and 230 on the interlayer insulating layer 190. The second power supply wire 380 may include a metal, an alloy, a metal nitride, a conductive metal oxide, a transparent conductive material, and/or the like. These may be used alone or in combination with each other. Alternatively, the second power supply wire 380 may have a multi-layer structure including a plurality of layers. In exemplary embodiments, the second power supply wire 380, the first power supply wire 350, the source electrode 210, and the drain electrode 230 may be located on the same layer, and formed simultaneously by using the same material. For example, after a first preliminary electrode layer is formed entirely on the interlayer insulating layer 190, the first preliminary electrode layer is selectively etched, so that the source electrode 210, the drain electrode 230, the second power supply wire 380, and the first power supply wire 350 may be formed at the same time.

Figure 12:
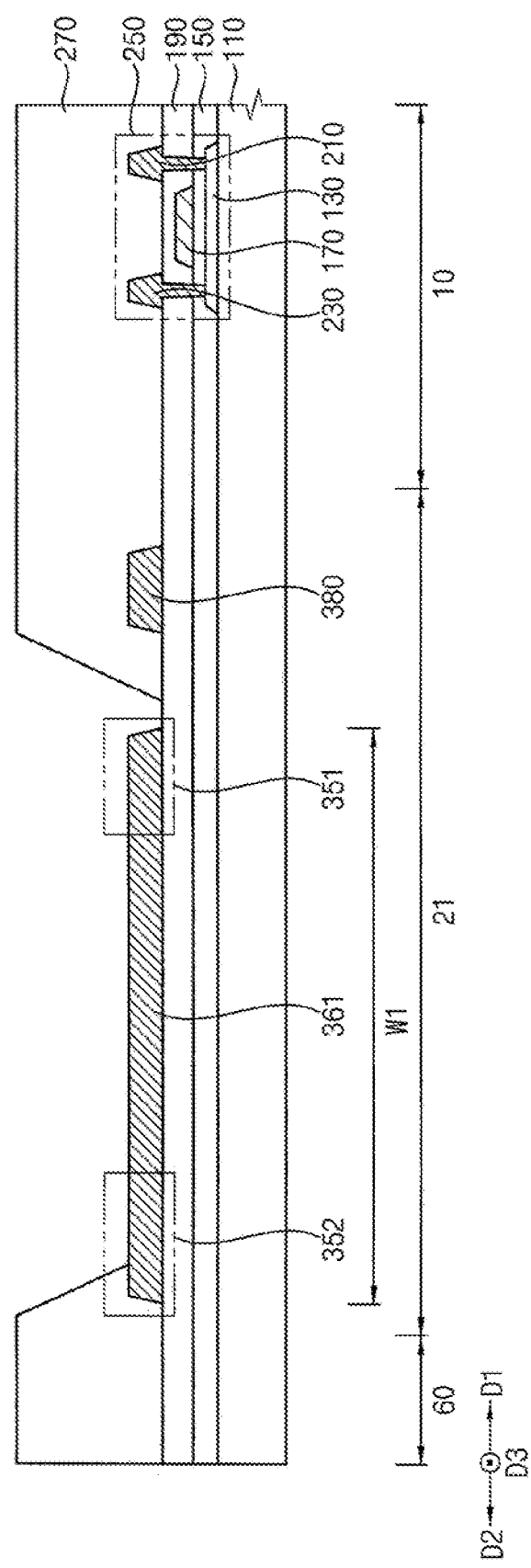
Figure 13:
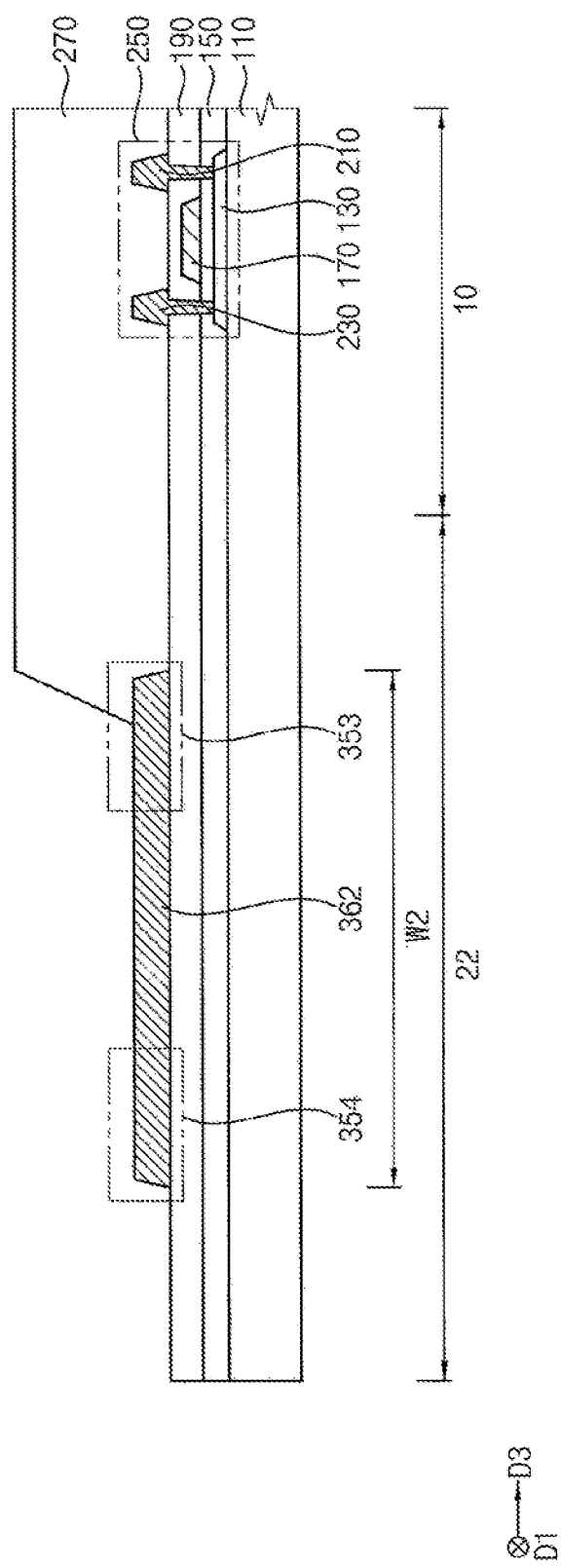

Referring to FIGS. 12 and 13, the planarization layer 270 may be formed on the interlayer insulating layer 190, the second power supply wire 380, a part of the first power supply wire 350, the source electrodes 210, and the drain electrodes 230. In exemplary embodiments, the planarization layer 270 located in the display area 10 adjacent to the first peripheral area 21 may be spaced apart from the first power supply wire 350, and may cover the second power supply wire 380. The planarization layer 270 located in the first peripheral area 21 adjacent to the pad area 60 may cover the second protrusion 352. In addition, the planarization layer 270 located in the display area 10 adjacent to the second peripheral area 22 may cover the third protrusion 353.

The planarization layer 270 located in the display area 10 may be formed to be relatively thick so as to sufficiently cover the source and drain electrodes 210 and 230. In this case, the planarization layer 270 may have a substantially planarized top surface, and a planarization process may be added with respect to the planarization layer 270 to implement the above planarized top surface of the planarization layer 270. The planarization layer 270 may be formed by using an organic material such as photoresist, polyacryl-based resin, polyimide-based resin, polyamide-based resin, siloxane-based resin, acryl-based resin, and/or epoxy-based resin.

Figure 14:
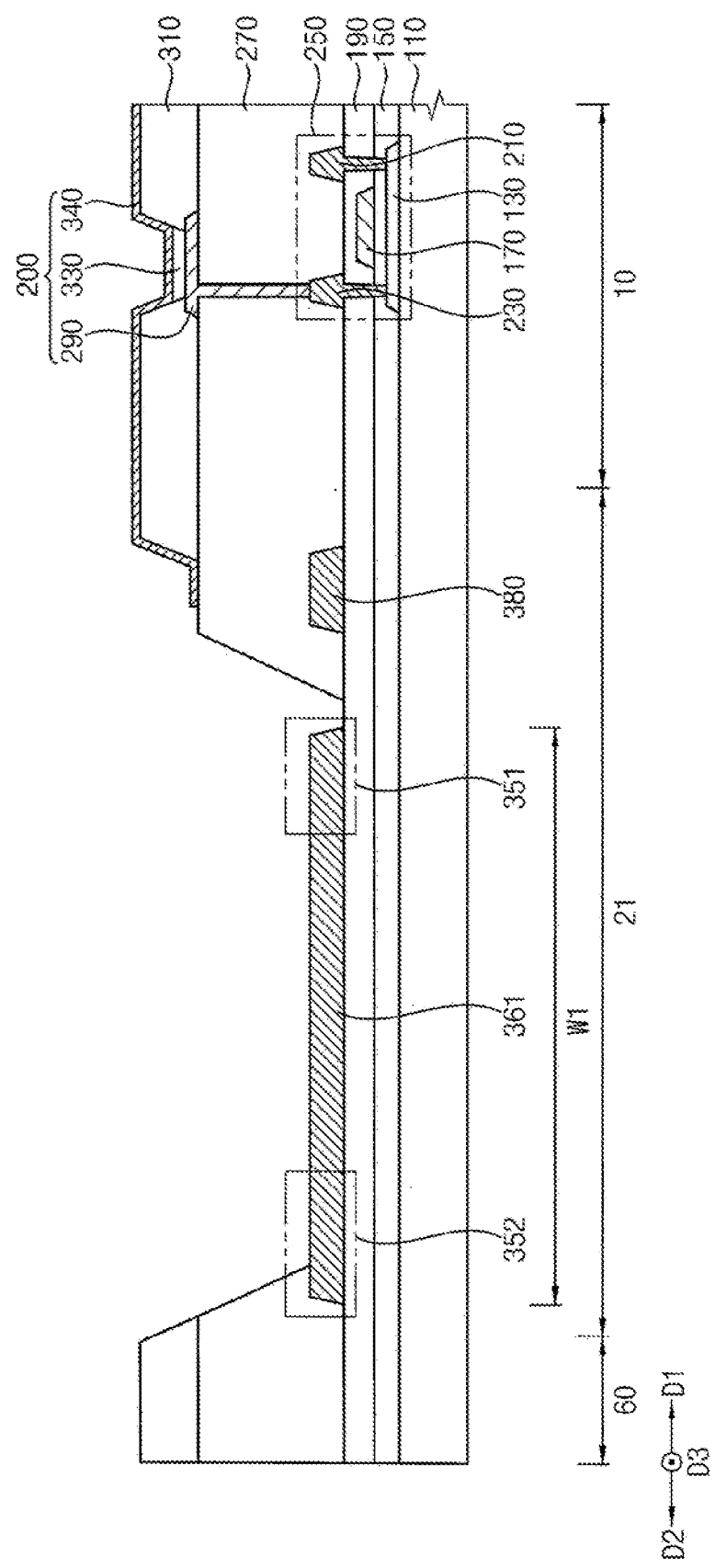
Figure 15:
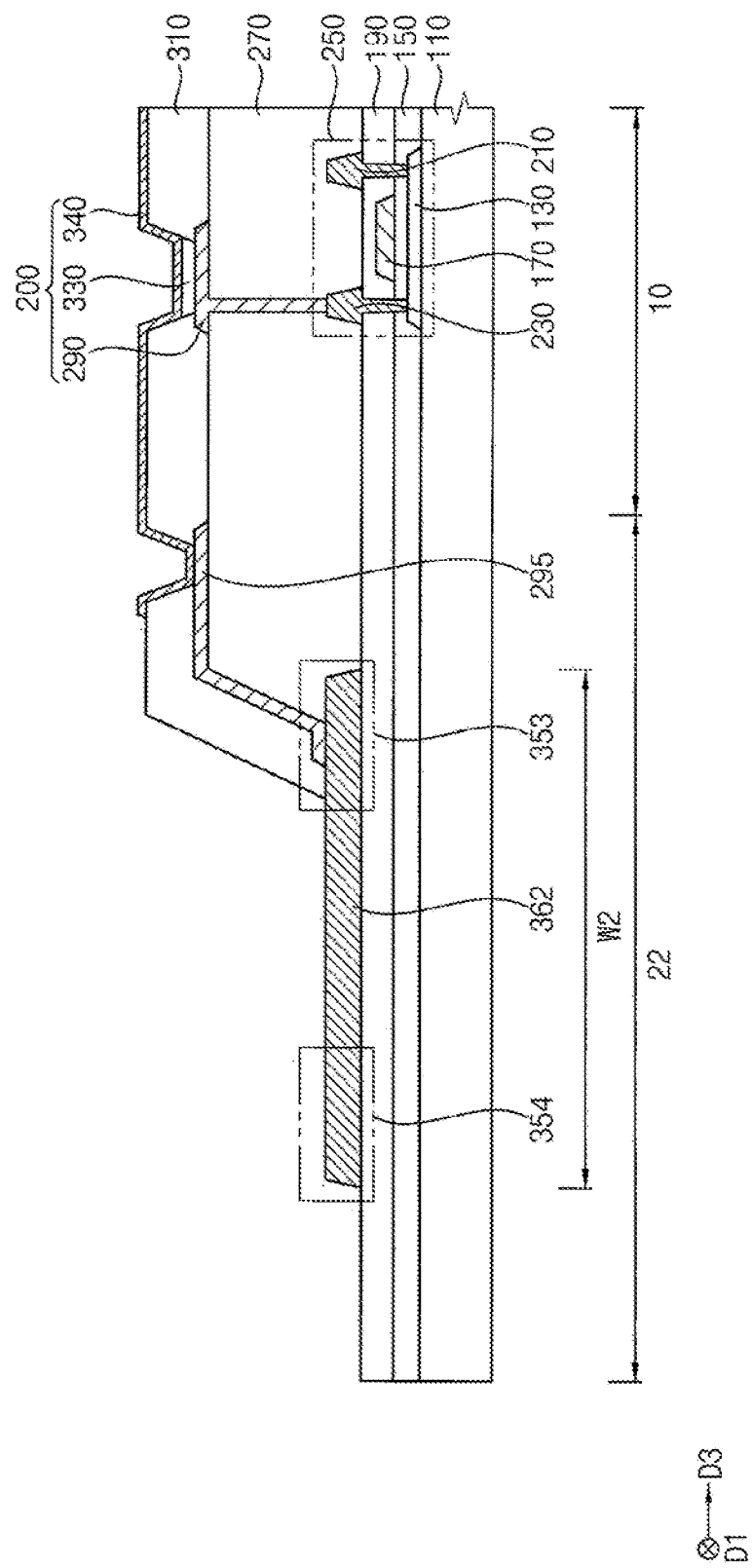

Referring to FIGS. 14 and 15, the lower electrodes 290 may be formed in the display area on the planarization layer 270. The lower electrodes 290 may be connected to the drain electrode 230 through a contact hole formed by removing a part of the planarization layer 270. Each of the lower electrodes 290 may be formed by using a metal, an alloy, a metal nitride, a conductive metal oxide, a transparent conductive material, or the like. These may be used alone or in combination with each other. Alternatively, the lower electrode 290 may have a multi-layer structure including a plurality of layers.

The connection pattern 295 may be formed in the peripheral area 20 on a part of the first power supply wire 350 and a part of the planarization layer 270. In exemplary embodiments, the connection pattern 295 may come into direct contact with the top surface of the planarization layer 270, a side wall of the planarization layer 270, and a part of the top surface of the third protrusion 353 in the second peripheral area 22. In addition, the connection pattern 295 might not be formed in the first peripheral area 21. The connection pattern 295 may be formed by using a metal, an alloy, a metal nitride, a conductive metal oxide, a transparent conductive material, or the like. These may be used alone or in combination with each other. Alternatively, the connection pattern 295 may have a multi-layer structure including a plurality of layers. In exemplary embodiments, the lower electrodes 290 and the connection pattern 295 may be located on the same layer. For example, after a second preliminary electrode layer is formed entirely on the lower substrate 110, the second preliminary electrode layer is selectively etched, so that the lower electrodes 290 and the connection pattern 295 may be formed simultaneously.

The pixel defining layer 310 may be formed on a part of the lower electrode 290, a part of the connection pattern 295 and the planarization layer 270. The pixel defining layer 310 may cover both sides of the lower electrode 290 and a side of the connection pattern 295, and expose a part of the top surface of the lower electrode 290. In exemplary embodiments, the pixel defining layer 310 adjacent to the first peripheral area 21 might not come into direct contact with the first wire portion 361, and the pixel defining layer 310 adjacent to the second peripheral area 22 may come into direct contact with a part of the second wire portion 362. The pixel defining layer 310 may be formed by using an organic material.

A light emitting layer 330 may be formed on the lower electrode 290 exposed by the pixel defining layer 310. The light emitting layer 330 may be formed using at least one light emitting material configured to emit color light (such as red light, green light, and blue light) that are different by sub-pixels. Alternatively, the light emitting layer 330 may be formed by laminating a plurality of light emitting materials capable of generating different color light such as red light, green light and blue light, such that white light may be emitted thereby. In this case, a color filter may be formed on the light emitting layer 330 The color filter may include at least one of a red color filter, a green color filter, and a blue color filter. Alternatively, the color filter also may include a yellow color filter, a cyan color filter, and a magenta color filter. The color filter may be formed using photosensitive resin, color photoresist, or the like.

The upper electrode 340 may be formed on a part of the connection pattern 295, on the pixel defining layer 310, and on the light emitting layer 330. In exemplary embodiments, the upper electrode 340 may cover the light emitting layer 330 and the pixel defining layer 310, and extend from the display area 10 to the peripheral area 20. In exemplary embodiments, the upper electrode 340 located in the second peripheral area 22 may come into direct contact with a part of the top surface of the connection pattern 295. In addition, the upper electrode 340 located in the first peripheral area 21 might not come into direct contact with the first wire portion 361. The upper electrode 340 may be formed by using a metal, an alloy, a metal nitride, a conductive metal oxide, a transparent conductive material, and/or the like. These may be used alone or in combination with each other. Alternatively, the upper electrode 340 may have a multi-layer structure including a plurality of layers. Accordingly, the light emitting structures 200 including the lower electrodes 290, the light emitting layers 330, and the upper electrodes 340 may be formed.

Figure 16:
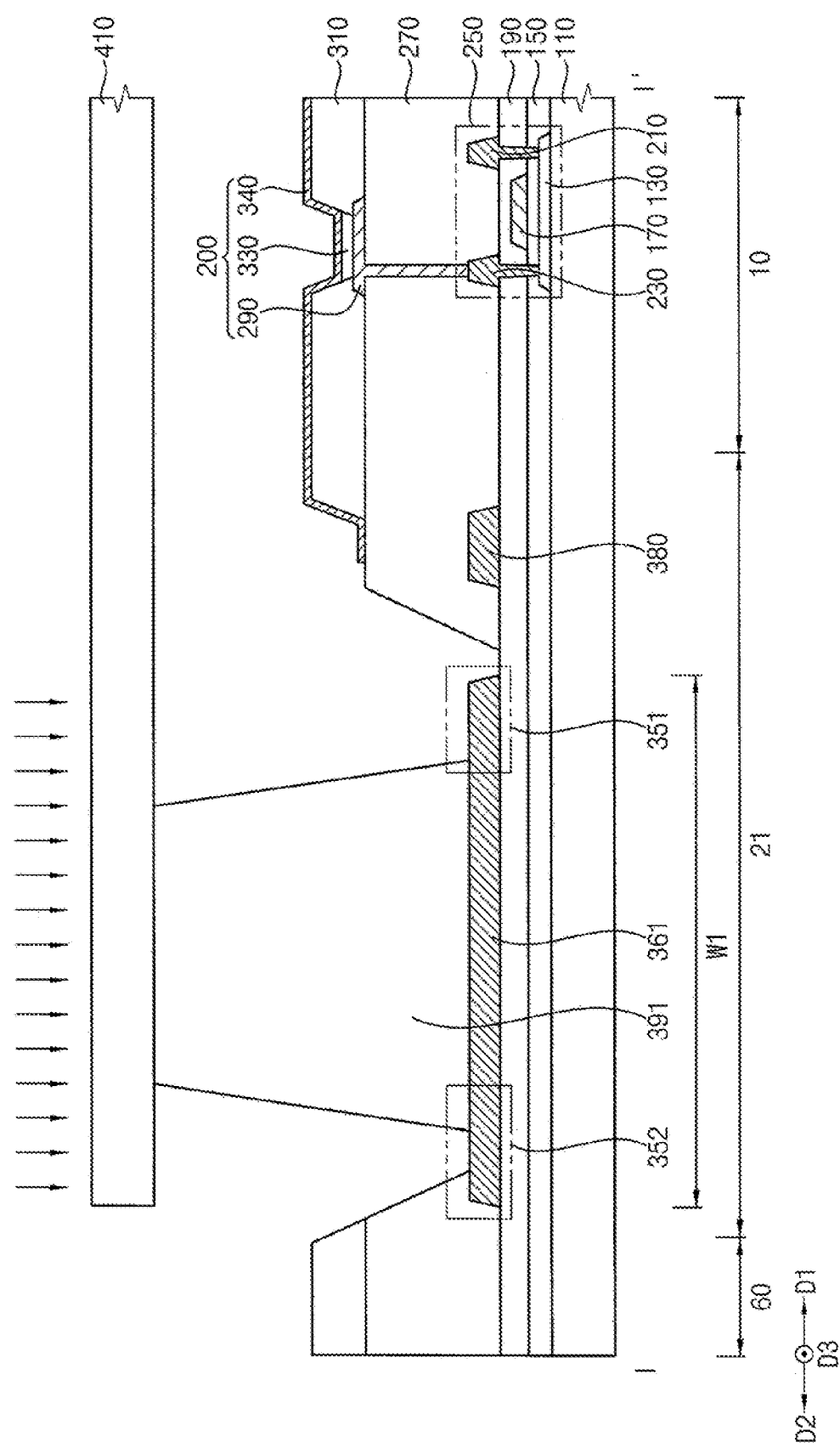
Figure 17:
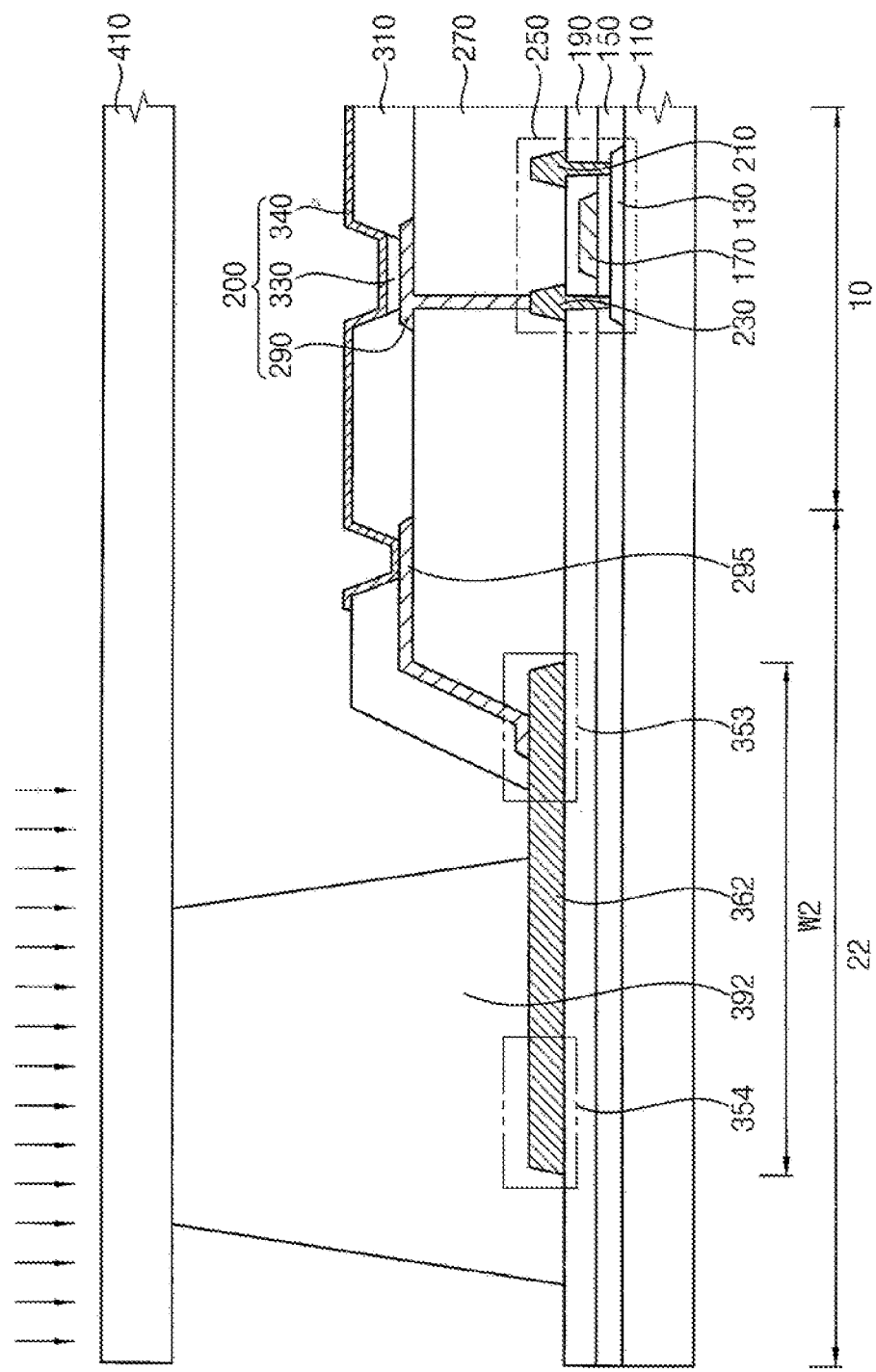

Referring to FIGS. 16 and 17, The sealant 390 may be formed in the peripheral area 20 on the first power supply wire 350. For example, the sealant 390 formed in the first peripheral area 21 is defined as a first sealing portion 391. The sealant 390 formed in the second peripheral area 22 is defined as a second sealing portion 392. However, the first sealing portion 391 and the second sealing portion 392 may be a single integrated unit (see FIG. 3). The bottom surface of the sealant 390 may come into direct contact with a part of the interlayer insulating layer 190 and/or a part of the first power supply wire 350.

For example, as shown in FIG. 16, the first sealing portion 391 may be formed exclusively on the first power supply wire 350. For example, the bottom surface of the first sealing portion 391 may come into direct contact with the top surface of the first power supply wire 350.

In addition, as shown in FIG. 17, the second sealing portion 392 may be formed on the first power supply wire 350 and the interlayer insulating layer 190 at the same time. For example, the bottom surface of the second sealing portion 392 may come into direct contact with the upper surface of the first power supply wire 350 and the top surface of the interlayer insulating layer 190 at the same time.

The sealant 390 may be formed using a frit or the like. In addition, the sealant 390 may further include a photocurable material. For example, the sealant 390 may include a mixture of an organic material and a photocurable material, and the photocurable material included in the sealant 390 may include epoxy acrylate-based resin, polyester acrylate-based resin, urethane acrylate-based resin, polybutadiene acrylate-based resin, silicone acrylate-based resin, alkyl acrylate-based resin, and/or the like.

The upper substrate 410 may be formed on the sealant 390 and the upper electrode 340. The upper substrate 410 may be formed using the same material as the lower substrate 110. For example, the upper substrate 410 may include a quartz substrate, a synthetic quartz substrate, a calcium fluoride substrate, a fluorine-doped (F-doped) quartz substrate, a sodalime glass substrate, a non-alkali glass substrate, and/or the like. Alternatively, after the sealant 390 is formed on the bottom surface of the upper substrate 410, the lower substrate 110 may be coupled thereto.

After the upper substrate 410 is formed on the sealant 390, ultraviolet rays, laser light, visible light, and/or the like may be used to expose a portion of the upper substrate 410 under which the sealant 390 is provided, and the mixture of the sealant 390 may be cured to obtain the sealant 390. For example, after the mixture of the organic material and the photocurable material is irradiated with laser light, the mixture may be changed from a solid state to a liquid state upon the exposure of the laser light, and the mixture in the liquid state may be cured into the solid state after a predetermined time. The upper substrate 410 may be sealed and coupled to the lower substrate 110 according to the state change of the mixture. Accordingly, the organic light emitting diode display device 100 shown in FIGS. 6 and 7 can be manufactured.

Figure 18:
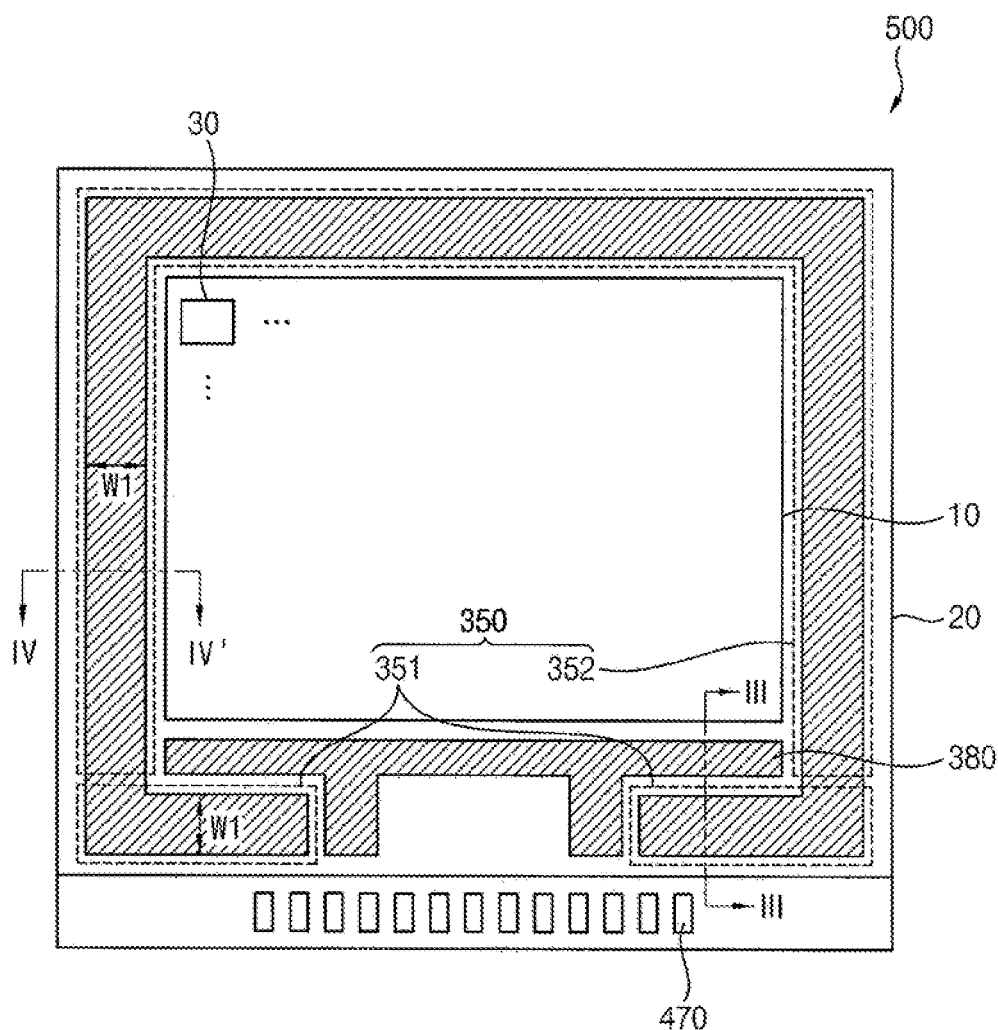
FIG. 18 is a plan view illustrating an organic light emitting diode display device according to exemplary embodiments of the present invention.
Figure 19:
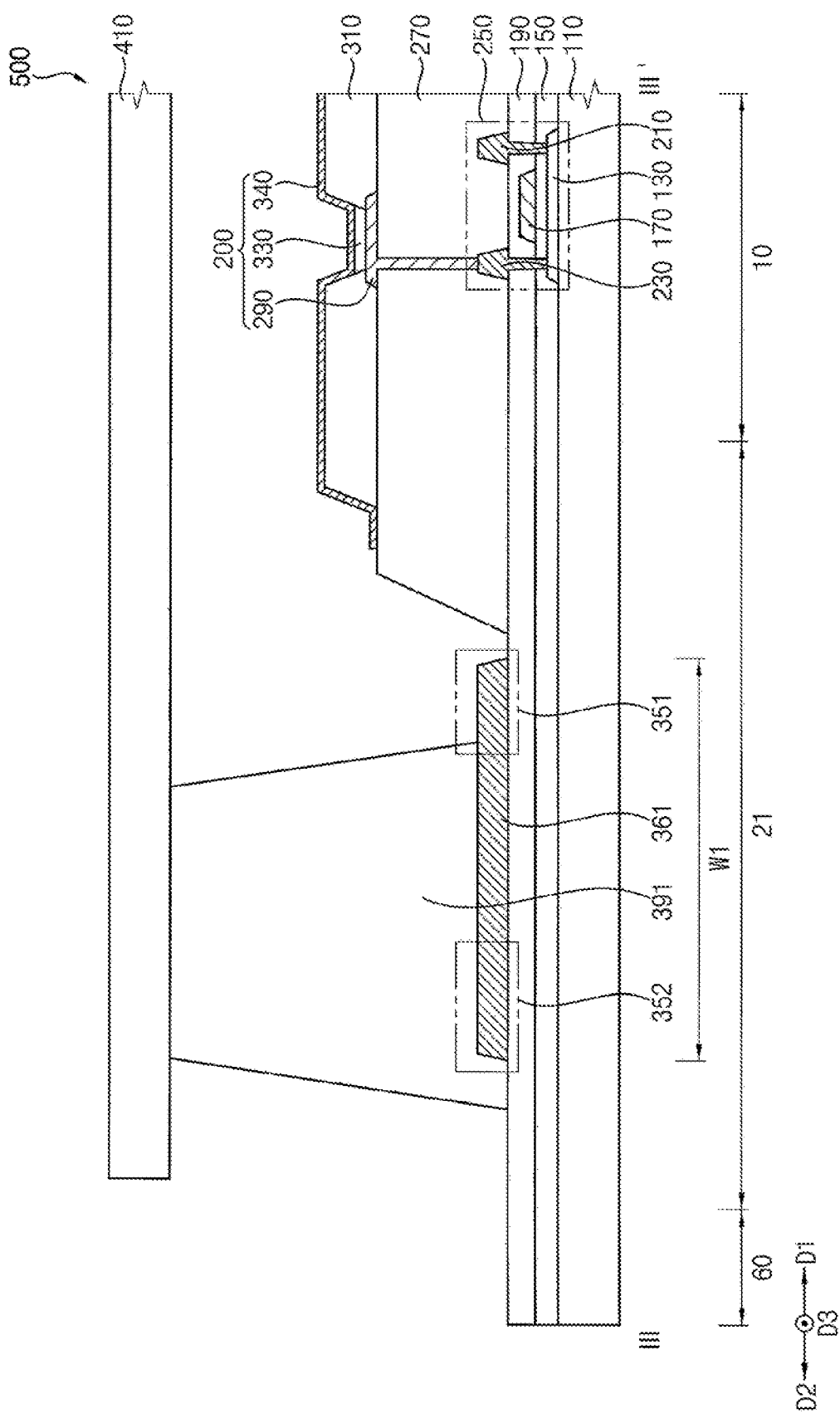
FIG. 19 is a cross-sectional view taken along line III-III' in FIG. 18.
Figure 20:
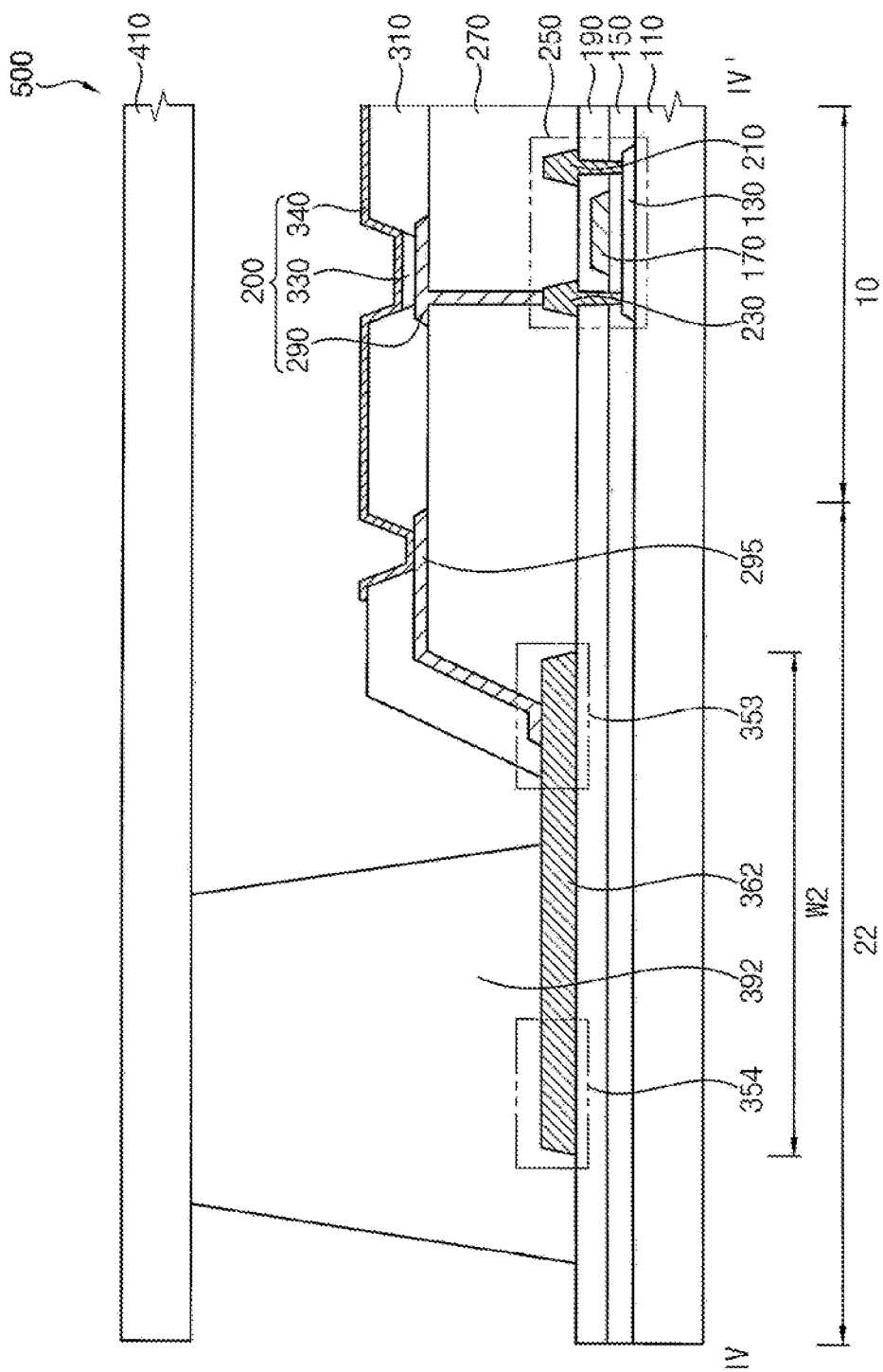
FIG. 20 is a cross-sectional view taken along line IV-IV' in FIG. 18.

FIG. 18 is a plan view showing an organic light emitting diode display device according to exemplary embodiments of the present invention. FIG. 19 is a cross-sectional view taken along line III-III' in FIG. 18. FIG. 20 is a cross-sectional view taken along line IV-IV' in FIG. 18. The organic light emitting diode display device 500 illustrated in FIGS. 18 and 19 may have a configuration substantially the same as or similar to the organic light emitting diode display device 100 described with reference to FIGS. 1 to 7, except for the first power supply wire 350. In FIGS. 18, 19, and 20, duplicate descriptions for components substantially the same as or similar to the components described with reference to FIGS. 1 to 7 will be omitted. It may therefore be assumed that those elements that are not described in detail herein are at least similar to corresponding elements that have already been described.

Referring to FIGS. 18 and 19, the organic light emitting diode display device 500 may include a lower substrate 110, a semiconductor device 250, a first power supply wire 350, a second power supply wire 380, a planarization layer 270, a connection pattern 295, a pixel defining layer 310, a sub-pixel structure 200, a sealant 390, an upper substrate 410, and the like. In exemplary embodiments, the sealant 390 may be divided into a first sealing portion 391 and a second sealing portion 392, and the first power supply wire 350 may be divided into a first wire portion 361 at least partially overlapping the first sealing portion 391 and a second wire portion 362 at least partially overlapping the second sealing portion 392.

The first power supply wire 350 may be disposed in the peripheral area 20 on the interlayer insulating layer 190. For example, the first power supply wire 350 may be disposed on the interlayer insulating layer 190 so as to be spaced apart from the source electrode 210 and the drain electrode 230.

The first power supply wire 350 (for example, the first wire portion 361) may be overlapped between the interlayer insulating layer 190 and the first sealing portion 391. The first power supply wire 350 located in the first peripheral area 21 may include a protrusion 331 protruding from the first side of the first sealing portion 391 in the first direction D1. Here, the protrusion may be defined as a first end 351 of the first power supply wire 350 located in the first peripheral area 21. For example, the first power supply wire 350 located in the first peripheral area 21 may include the first end 351 and a second end 352. For example, the first end 351 may be adjacent to the sub-pixel structure 200, and the second end 352 may at least partially overlap the first sealing portion 392. For example, the first end 351 may be exposed, and spaced apart from the planarization layer 270 located in the display area 10 adjacent to the first peripheral area 21. The second end 352 may be covered by the first sealing portion 391 and might not be exposed. The first power supply wire 350 located in the first peripheral area 21 may have the first width W1.

The first power supply wire 350 (for example, the second wire portion 362) may be overlapped between the interlayer insulating layer 190 and the second sealing portion 392. The first power supply wire 350 located in the second peripheral area 22 may include a protrusion protruding from a first side of the second sealing portion 392 in the third direction D3, and the first power supply wire 350 located in the second peripheral area 21 may have the first width W1 (see FIG. 18). For example, the first power supply wire 350 may have the same width in the peripheral area 20, and a shape overlapped between the first power supply wire 350 and the sealant 390 located in the first peripheral area 21 may be substantially the same as a shape overlapped between the first power supply wire 350 and the sealant 390 located in the second peripheral area 22.

The present invention may be applied to various display devices including an OLED display device. For example, the present invention may be applied to an in-vehicle display device, an in-ship display device, an in-aircraft display device, portable communication devices, display devices for display or for information transfer, a medical-display device, etc.

The foregoing is illustrative of exemplary embodiments of the present inventive concept. Although a few exemplary embodiments of the present inventive concept have been described, those skilled in the art will readily appreciate that many modifications are possible in the example embodiments without materially departing from the novel teachings and aspects of the present inventive concept. Accordingly, all such modifications are intended to be included within the scope of the present disclosure.

What is claimed is:

1. An organic light emitting diode display device, comprising:
a lower substrate including a display area, a peripheral area, and a pad area, the peripheral area including a first peripheral area that is adjacent to the pad area and a second peripheral area;
a sub-pixel structure disposed in the display area of the lower substrate;
an upper substrate disposed on the sub-pixel structure;
a first power supply wire disposed between the lower substrate and the sealant; and
a sealant disposed on the peripheral area of the lower substrate and between the lower substrate and the upper substrate, the sealant including a first sealing portion disposed in the first peripheral area and a second sealing portion disposed in the second peripheral area,
wherein a part of a lower surface of the second sealing portion is not overlapped with the first power supply wire disposed in the second peripheral area.

2. The organic light emitting diode display device of claim 1, wherein the first power supply wire disposed in the second peripheral area includes a protrusion protruding from a first side of the second sealing portion in a direction toward the display area.

3. The organic light emitting diode display device of claim 2, wherein the first power supply wire disposed in the second peripheral area includes a first end corresponding to the protrusion and a second end opposite to the first end, and the second end is covered by the second sealing portion.

4. The organic light emitting diode display device of claim 2, further comprising:
a planarization layer disposed between the lower substrate and the sub-pixel structure, the planarization layer including organic materials.

5. The organic light emitting diode display device of claim 4, wherein a part of the protrusion of the first power supply wire is overlapped with the planarization layer.

6. The organic light emitting diode display device of claim 1, wherein the sealant is in direct contact with the first power supply wire.

7. The organic light emitting diode display device of claim 1, further comprising:
a plurality of pad electrodes disposed in the pad area.

8. The organic light emitting diode display device of claim 1, wherein the first power supply wire includes a first wire portion located in a part of the first peripheral area and a second wire portion located in the second peripheral area, and the first and second wire portions are together, a single integrated unit.

9. The organic light emitting diode display device of claim 8, wherein the first power supply wire has a ring shape with an opened lower portion, and the ring shape of the first supply wire at least partially circumscribes the display area in the plan view.

10. The organic light emitting diode display device of claim 1, wherein the first power supply wire is configured to receive a low-power supply voltage.

11. The organic light emitting diode display device of claim 10, further comprising:
a second power supply wire disposed in the first peripheral area on the lower substrate and configured to receive a high-power supply voltage.

12. The organic light emitting diode display device of claim 1, wherein the first sealing portion and the second sealing portion are a single integrated unit.

13. The organic light emitting diode display device of claim 1, wherein the sub-pixel structure includes a lower electrode disposed on the lower substrate, a light emitting layer disposed on the lower electrode, and an upper electrode disposed on the light emitting layer, the first power supply wire is configured to receive a low-power supply voltage, and the low-power supply voltage is provided to the upper electrode through the first power supply wire.

14. The organic light emitting diode display device of claim 13, further comprising:
a connection pattern disposed between the upper electrode and the first power supply wire, the upper electrode being electrically connected to the first power supply wire through the connection pattern.

15. The organic light emitting diode display device of claim 14, wherein the connection pattern is simultaneously formed with the lower electrode using a same material.

16. The organic light emitting diode display device of claim 1, further comprising:
a semiconductor element disposed between the sub-pixel structure and the lower substrate,
wherein the semiconductor element includes an active layer disposed in the display area on the lower substrate, a gate insulating layer disposed on the active layer, a gate electrode disposed on the gate insulating layer, an interlayer insulating layer disposed on the gate electrode, and source and drain electrodes each disposed on the interlayer insulating layer.

17. The organic light emitting diode display device of claim 16, wherein the first power supply wire is disposed on a same layer as the source and drain electrodes.

18. The organic light emitting diode display device of claim 16, wherein the first sealing portion contacts the first power supply wire, and the second sealing portion contacts both the first power supply wire and the interlayer insulating layer.

19. The organic light emitting diode display device of claim 1, wherein the sealant has a rectangular planar shape disposed at only a single side of the display area in the plan view.

20. The organic light emitting diode display device of claim 1, wherein the peripheral area at least partially surrounds the display area, and the pad area is disposed at one side of the peripheral area.

* * * * *